(12) United States Patent
Cooper

(10) Patent No.: US 6,392,568 B1
(45) Date of Patent: May 21, 2002

(54) DATA COMPRESSION AND DECOMPRESSION METHOD AND APPARATUS WITH EMBEDDED FILTERING OF DYNAMICALLY VARIABLE INFREQUENTLY ENCOUNTERED STRINGS

(75) Inventor: Albert B. Cooper, New York, NY (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/801,358

(22) Filed: Mar. 7, 2001

(51) Int. Cl.[7] .............................. H03M 7/00; H03M 7/34
(52) U.S. Cl. ........................... 341/51; 341/50; 341/106; 708/203
(58) Field of Search ............................. 341/51, 50, 63, 341/87, 106; 708/203

(56) References Cited

U.S. PATENT DOCUMENTS

| | | | | |
|---|---|---|---|---|
| 4,558,302 A | * | 12/1985 | Welch | 341/51 |
| 5,049,881 A | * | 9/1991 | Gibson et al. | 341/95 |
| 5,151,697 A | * | 9/1992 | Bunton | 341/51 |
| 5,373,290 A | * | 12/1994 | Lempel et al. | 341/51 |
| 5,389,922 A | * | 2/1995 | Seroussi et al. | 341/51 |
| 5,455,576 A | * | 10/1995 | Clark, II et al. | 341/50 |
| 5,455,943 A | * | 10/1995 | Chambers, IV | 341/51 |
| 5,805,086 A | * | 9/1998 | Brown et al. | 341/51 |
| 5,951,623 A | * | 9/1999 | Reynar et al. | 341/95 |

\* cited by examiner

*Primary Examiner*—Peguy Jeanpierre
*Assistant Examiner*—Jean Bruner Jeanglaude
(74) *Attorney, Agent, or Firm*—Albert B. Cooper; Mark T. Starr

(57) ABSTRACT

A data compression and decompression system based on the LZW data compression and decompression methodology that includes exclusion tables for storing strings that are infrequently encountered. If an extended string formed for updating the compressor and decompressor dictionaries is included in the exclusion tables, the extended string is not stored and the code counter for assigning codes to dictionary strings is not advanced. In this manner, dictionary codes are not usurped by infrequently encountered strings. The exclusion tables are dynamically modified in accordance with the input data by deleting strings from the exclusion tables that are frequently encountered therein and by adding infrequently encountered strings to the exclusion tables.

74 Claims, 25 Drawing Sheets

INPUT DATA CHARACTER STREAM $a_1\ a_2\ a_3\ a_4\ a_5\ b_1\ a_6\ b_2\ a_7\ b_3\ a_8\ b_4\ a_9\ b_5\ c_1\ a_{10}\ b_6\ c_2\ a_{11}\ b_7\ c_3\ a_{12}\ b_8\ c_4$

| ACT-ION | CURRENT MATCH | CURRENT CHAR | EXTENDED STRING REGISTER | EXTENDED STRING CTNR | CODE CNTR | DICTIONARY CODE | DICTIONARY CHAR | DICTIONARY HIT CTR | DICTIONARY CHAR CTR | SING CHAR TABLE | CTR | OUTPUT | BLOCKS OF FIG. 4 |
|---|---|---|---|---|---|---|---|---|---|---|---|---|---|
| 1 | $a_1$ | | $a_1$ | 1 | 5 | | | | | $a_1$ | 1 | | 90-95,98-100 |
| 2 | | $a_2$ | $a_1 a_2$ | 2 | | $a_1$ | $a_2$ | 1 | 2 | | | $a_1$ | 110-113,116,120-124 |
| 3 | $a_2$ | | $a_2$ | 1 | 6 | | | | | $a_2$ | 2 | | 125,127,128,133,134,95,98-100 |
| 4 | | $a_3$ | $a_2 a_3$ | 2 | | $(a_1)$ | $(a_2)$ | 2 | | | | | 110-114 |
| 5 | 5 | | $a_2 a_3 a_4$ | 3 | 7 | 5 | $a_4$ | 1 | 3 | | | 5 | 115,110-113,116,120-124 |
| 6 | $a_4$ | | $a_4$ | 1 | | | | | | $a_4$ | 3 | | 125,127,128,133,134,95,98-100 |
| 7 | | $a_5$ | $a_4 a_5$ | 2 | | $(a_1)$ | $(a_2)$ | 3 | | | | | 110-114 |
| 8 | 5 | | $a_4 a_5 b_1$ | 3 | 8 | 5 | $b_1$ | 1 | 3 | | | 5 | 115,110-113,116,120-124 |
| 9 | $b_1$ | | $b_1$ | 1 | | | | | | $b_1$ | 1 | | 125-128,133,134,95,98-100 |
| 10 | | $a_6$ | $b_1 a_6$ | 2 | 9 | $b_1$ | $a_6$ | 1 | 2 | | | $b_1$ | 110-113,116,120-124 |
| 11 | $a_6$ | | $a_6$ | 1 | | | | | | $a_6$ | 4 | | 125,127,128,133,134,95,98-100 |
| 12 | | $b_2$ | $a_6 b_2$ | 2 | 10 | $a_6$ | $b_2$ | 1 | 2 | | | $a_6$ | 110-113,116,120-124 |
| 13 | $b_2$ | | $b_2$ | 1 | | | | | | $b_2$ | 2 | | 125,127,128,133,134,95,98-100 |
| 14 | | $a_7$ | $b_2 a_7$ | 2 | | $(b_1)$ | $(a_6)$ | 2 | | | | | 110-114 |
| 15 | 8 | | $b_2 a_7 b_3$ | 3 | 11 | 8 | $b_3$ | 1 | 3 | | | 8 | 115,110-113,116,120-124 |
| 16 | $b_3$ | | $b_3$ | 1 | | | | | | $b_3$ | 3 | | 125,127,128,133,134,95,98-100 |
| 17 | | $a_8$ | $b_3 a_8$ | 2 | | $(b_1)$ | $(a_6)$ | 3 | | | | | 110-114 |
| 18 | 8 | | $b_3 a_8 b_4$ | 3 | | $(8)$ | $(b_3)$ | 2 | | | | | 115,110-114 |

Figure 11A

| | | | | | | | | | | | |
|---|---|---|---|---|---|---|---|---|---|---|---|
| 19 | 10 | | $a_9$ | $b_3a_8b_4a_9$ | 4 | 10 | $a_9$ | 1 | 4 | | 10 | 115,110-113,116,120-124 |
| 20 | $a_9$ | | | $a_9$ | 1 | 12 | | | | $a_9$ | 5 | 125,127,128,133,134,95,98-100 |
| 21 | | | $b_5$ | $a_9b_5$ | 2 | $(a_6)$ | $(b_2)$ | 2 | | | | 110-114 |
| 22 | 9 | | | $a_9b_5c_1$ | 3 | 9 | $c_1$ | 1 | 3 | | 9 | 115,110-113,116,120-124 |
| 23 | $c_1$ | | | $c_1$ | 1 | 13 | | | | $c_1$ | $c_1$ | 125,127,128,133,134,95,98-100 |
| 24 | | | $a_{10}$ | $c_1a_{10}$ | 2 | | $a_{10}$ | 1 | 2 | | | 110-113,116,120-124 |
| 25 | $a_{10}$ | | | $a_{10}$ | 1 | 14 | | | | $a_{10}$ | 6 | 125,127,128,133,134,95,98-100 |
| 26 | | | $b_6$ | $a_{10}b_6$ | 2 | $(a_6)$ | $(b_2)$ | 3 | | | | 110-114 |
| 27 | 9 | | $c_2$ | $a_{10}b_6c_2$ | 3 | 9 | $(c_1)$ | 2 | | | | 115,110-114 |
| 28 | 12 | | $a_{11}$ | $a_{10}b_6c_2a_{11}$ | 4 | 12 | $a_{11}$ | 1 | 4 | | 12 | 115,110-113,116,120-124 |
| 29 | $a_{11}$ | | | $a_{11}$ | 1 | 15 | | | | $a_{11}$ | 7 | 125,127,128,133,134,95,98-100 |
| 30 | | | $b_7$ | $a_{11}b_7$ | 2 | $(a_6)$ | $(b_2)$ | 4 | | | | 110-114 |
| 31 | 9 | | $c_3$ | $a_{11}b_7c_3$ | 3 | 9 | $(c_1)$ | 3 | | | | 115,110-114 |
| 32 | 12 | | $a_{12}$ | $a_{11}b_7c_3a_{12}$ | 4 | (12) | $(a_{11})$ | 2 | | | | 115,110-114 |
| 33 | 14 | | $b_8$ | $a_{11}b_7c_3a_{12}b_8$ | 5 | | | | | | 14 | 115,110-113,116,120 |
| 34 | $b_8$ | | | $b_8$ | 1 | | | | | $b_8$ | 4 | 133,134,95,98-100 |
| 35 | | | $c_4$ | $b_8c_4$ | 2 | $b_8$ | $c_4$ | 1 | 2 | | $b_8$ | 110-113,116,120-124 |
| 36 | | | | | | OVER FLOW | | | | | $c_4$ | 125-128,140-143 |

| Fig. 11A |
|---|
| Fig. 11B |

INPUT DATA CHARACTER STREAM $a_1\ a_2\ a_3\ a_4\ a_5\ b_1\ a_6\ b_2\ a_7\ b_3\ a_8\ b_4\ a_9\ b_5\ c_1\ a_{10}\ b_6\ c_2\ a_{11}\ b_7\ c_3\ a_{12}\ b_8\ c_4$
$c_5\ d_1\ a_{13}\ a_{14}\ a_{15}\ a_{16}\ a_{17}\ b_9\ a_{18}\ b_{10}\ a_{19}\ b_{11}\ a_{20}\ b_{12}\ a_{21}\ b_{13}\ c_6\ a_{22}\ b_{14}\ b_{15}\ d_2$

| ACT-ION | CURRENT MATCH | CURRENT CHAR | EXTENDED STRING REGISTER | EXTENDED STRING CTNR | CODE CNTR | DICTIONARY CODE | DICTIONARY CHAR | DICTIONARY HIT CTR | DICTIONARY CHAR CTR | SING CHAR TABLE | CTR | EXCL TBLS | CTR | OUT PUT | BLOCKS OF FIG. 4 |
|---|---|---|---|---|---|---|---|---|---|---|---|---|---|---|---|
| 1 | $a_1$ | | $a_1$ | 1 | 5 | | | | | $a_1$ | 1 | | | | 90-95,98-100 |
| 2 | | $a_2$ | $a_1 a_2$ | 2 | | $a_1$ | $a_2$ | 1 | 2 | | | | | $a_1$ | 110-113,116,120-124 |
| 3 | $a_2$ | | $a_2$ | 1 | 6 | | | | | $a_2$ | 2 | | | | 125,127,128,133,134,95,98-100 |
| 4 | | $a_3$ | $a_2 a_3$ | 2 | | $(a_1)$ | $(a_2)$ | 2 | | | | | | | 110-114 |
| 5 | 5 | $a_4$ | $a_2 a_3 a_4$ | 3 | | | | | | | | aaa | | 5 | 115,110-113,116,120,121,135 |
| 6 | $a_4$ | | $a_4$ | 1 | | | | | | $a_4$ | 3 | | | | 133,134,95,98-100 |
| 7 | | $a_5$ | $a_4 a_5$ | 2 | | $(a_1)$ | $(a_2)$ | 3 | | | | | | | 110-114 |
| 8 | 5 | $b_1$ | $a_4 a_5 b_1$ | 3 | | | | | | | | aab | 1 | 5 | 115,110-113,116,120,121,135 |
| 9 | $b_1$ | | $b_1$ | 1 | | | | | | $b_1$ | 1 | | | | 133,134,95,98-100 |
| 10 | | $a_6$ | $b_1 a_6$ | 2 | | $b_1$ | $a_6$ | 1 | 2 | | | | | $b_1$ | 110-113,116,120-124 |
| 11 | $a_6$ | | $a_6$ | 1 | 7 | | | | | $a_6$ | 4 | | | | 125,127,128,133,134,95,98-100 |
| 12 | | $b_2$ | $a_6 b_2$ | 2 | | $a_6$ | $b_2$ | 1 | 2 | | | | | $a_6$ | 110-113,116,120-124 |
| 13 | $b_2$ | | $b_2$ | 1 | 8 | | | | | $b_2$ | 2 | | | | 125-128,133,134,95,98-100 |
| 14 | | $a_7$ | $b_2 a_7$ | 2 | | $(b_1)$ | $(a_6)$ | 2 | | | | | | | 110-114 |
| 15 | 6 | $b_3$ | $b_2 a_7 b_3$ | 3 | | 6 | $b_3$ | 1 | 3 | | | | | 6 | 115,110-113,116,120-124 |
| 16 | $b_3$ | | $b_3$ | 1 | 9 | | | | | $b_3$ | 3 | | | | 125,127,128,133,134,95,98-100 |

*Figure 13A*

| | | | | | | | | | | | | |
|---|---|---|---|---|---|---|---|---|---|---|---|---|
| 17 | | $a_8$ | | 2 | | $(b_1)$ | | 3 | | | | 110–114 |
| 18 | 6 | $b_4$ | $b_3a_8$ | 3 | | (6) | $(b_3)$ | 2 | | | baba | 115,110–114 |
| 19 | 8 | $a_9$ | $b_3a_8b_4$ | 4 | | | | | | | | 115,110–113,116,120,121,135 |
| 20 | $a_9$ | | $b_3a_8b_4a_9$ | 1 | | | | | $a_9$ | 5 | | 133,134,95,98–100 |
| 21 | | $b_5$ | $a_9$ | 2 | | $(a_6)$ | $(b_2)$ | 2 | | | | 110–114 |
| 22 | 7 | $c_1$ | $a_9b_5$ | 3 | | 7 | $c_1$ | 1 | | | | 115,110–113,116,120–124 |
| 23 | $c_1$ | | $a_9b_5c_1$ | | 10 | | | 3 | | | c | 125,127,128,133,134,95–97 |
| 24 | $a_{10}$ | | | 1 | | | | | $a_{10}$ | 6 | | 94,95,98–100 |
| 25 | | $b_6$ | $a_{10}$ | 2 | | $(a_6)$ | $(b_2)$ | 3 | | | | 110–114 |
| 26 | 7 | $c_2$ | $a_{10}b_6$ | 3 | | (7) | $(c_1)$ | 2 | | | | 115,110–114 |
| 27 | 9 | $a_{11}$ | $a_{10}b_6c_2$ | 4 | | 9 | $a_{11}$ | 1 | | | | 115,110–113,116,120–124 |
| 28 | $a_{11}$ | | $a_{10}b_6c_2a_{11}$ | 1 | 11 | | | 4 | $a_{11}$ | 7 | | 125,127,128,133,134,95,98–100 |
| 29 | | $b_7$ | $a_{11}$ | 2 | | $(a_6)$ | $(b_2)$ | 4 | | | | 110–114 |
| 30 | 7 | $c_3$ | $a_{11}b_7$ | 3 | | (7) | $(c_1)$ | 3 | | | | 115,110–114 |
| 31 | 9 | $a_{12}$ | $a_{11}b_7c_3$ | 4 | | (9) | $(a_{11})$ | 2 | | | | 115,110–114 |
| 32 | 10 | $b_8$ | $a_{11}b_7c_3a_{12}$ | 5 | | | | | | | | 115,110–113,116,120 |
| 33 | $b_8$ | | $a_{11}b_7c_3a_{12}b_8$ | 1 | | | | | $b_8$ | 4 | | 133,134,95,98–100 |
| 34 | | $c_4$ | $b_8$ | 2 | | | | | | | bc 1 | 110–113,116,120,121,135 |
| 35 | $c_4$ | | $b_8c_4$ | | | | | | | | c 2 | 133,134,95–97 |
| 36 | $c_5$ | | | | | | | | | | c 3 | 94–97 |

*Figure 13B*

| | | | | | | | | | | | |
|---|---|---|---|---|---|---|---|---|---|---|---|
| 37 | $d_1$ | | | | | | | | | | 94,95,98-100 |
| 38 | $a_{13}$ | $d_1a_{13}$ | 2 | | $d_1$ | $a_{13}$ | 1 | | $d_1$ | | 110-113,116,120-124 |
| 39 | | $a_{13}$ | 1 | 12 | | | 2 | | | | | 125,127,128,133,134,95,98-100 |
| 40 | $a_{14}$ | $a_{13}a_{14}$ | 2 | | $(a_1)$ | $(a_2)$ | | $a_{13}$ | 8 | | | 110-114 |
| 41 | $a_{15}$ | $a_{13}a_{14}a_{15}$ | 3 | | | | 4 | | | aaa | 2 | 115,110-113,116,120,121,135 |
| 42 | | $a_{15}$ | 1 | | | | | $a_{15}$ | 9 | | | 133,134,95,98-100 |
| 43 | $a_{16}$ | $a_{15}a_{16}$ | 2 | | $(a_1)$ | $(a_2)$ | 5 | | | | 5 | 110-114 |
| 44 | $a_{17}$ | $a_{15}a_{16}a_{17}$ | 3 | | | | | | | aaa | | 115,110-113,116,120,121,135 |
| 45 | | $a_{17}$ | 1 | | | | | $a_{17}$ | 10 | | 3 | 133,134,95,98-100 |
| 46 | $b_9$ | $a_{17}b_9$ | 2 | | $(a_6)$ | $(b_2)$ | 5 | | | | | 110-114 |
| 47 | $a_{18}$ | $a_{17}b_9a_{18}$ | 3 | | 7 | $a_{18}$ | 1 | 3 | | | 5 | 115,110-113,116,120-124 |
| 48 | | $a_{18}$ | 1 | 13 | | | | $a_{18}$ | 11 | | 7 | 125,127,128,133,134,95,98-100 |
| 49 | $b_{10}$ | $a_{18}b_{10}$ | 2 | | $(a_6)$ | $(b_2)$ | 6 | | | | | 110-114 |
| 50 | $a_{19}$ | $a_{18}b_{10}a_{19}$ | 3 | | (7) | $(a_{18})$ | 2 | | | | | 115,110-114 |
| 51 | $b_{11}$ | $a_{18}b_{10}a_{19}b_{11}$ | 4 | | 12 | $b_{11}$ | 1 | 4 | | | 12 | 115,110-113,116,120-124 |
| 52 | | $b_{11}$ | 1 | 14 | | | | $b_{11}$ | 5 | | | 125,127,128,133,134,95,98-100 |
| 53 | $a_{20}$ | $b_{11}a_{20}$ | 2 | | $(b_1)$ | $(a_6)$ | 4 | | | | | 110-114 |
| 54 | $b_{12}$ | $b_{11}a_{20}b_{12}$ | 3 | | (6) | $(b_3)$ | 3 | | | | | 115-110-114 |
| 55 | $a_{21}$ | $b_{11}a_{20}b_{12}a_{21}$ | 4 | | | | | | | baba | 2 | 115,110-113,116,120,121,135 |
| 56 | | $a_{21}$ | 1 | | | | | $a_{21}$ | 12 | | 8 | 133,134,95,98-100 |

*Figure 13C*

| | | | | | | (a₆) | 7 | | | | 110-114 |
|---|---|---|---|---|---|---|---|---|---|---|---|
| 57 | | | | 2 | | | 7 | | | | 110-114 |
| 58 | 7 | b₁₃ | a₂₁b₁₃ | 3 | | (7) | (c₁) | 4 | | | 115,110-114 |
| 59 | 9 | c₆ | a₂₁b₁₃c₆ | 4 | | (9) | (a₁₁) | 3 | | | 115,110-114 |
| 60 | 10 | a₂₂ | a₂₁b₁₃c₆a₂₂ | 5 | | | | | | 10 | 115,110-113,116,120 |
| 61 | b₁₄ | | a₂₁b₁₃c₆a₂₂b₁₄ | 1 | | | | | | | 133,134,95,98-100 |
| 62 | | b₁₄ | b₁₄ | 2 | | b₁₄ | b₁₅ | 1 | b₁₄ | 6 | b₁₄ | 110-113,116,120-124 |
| 63 | b₁₅ | | b₁₄b₁₅ | 1 | 15 | b₁₅ | | | | | 125,127,128,133,134,95,98-100 |
| 64 | | b₁₅ | b₁₅ | 2 | | b₁₅ | d₂ | 1 | b₁₅ | 7 | b₁₅ | 110-113,116,120-124 |
| 65 | d₂ | | b₁₅d₂ | | | | | 2 | | | d₂ | 125-128,140-143 |
|    |    |   |         | OVER FLOW |  |  |  |  |  |  |   |

| Fig. 13A |
|---|
| Fig. 13B |
| Fig. 13C |
| Fig. 13D |

INPUT COMPRESSED CODE STREAM
$a_1$ 5 5 $b_1$ $a_2$ 8 10 9 $c_1$ 12 14 $b_2$ $c_2$

| ACT-ION | PREV CODE | CURR CODE | PREVIOUS STRING BUFFER | PRE STR CTR | CURRENT STRING BUFFER | CUR STR CTR | EXTENDED STRING REGISTER | CODE CNTR | DICTIONARY CODE | DICTIONARY CHAR | HIT CTR | CHAR CNTR | SING CHAR TABLE | CTR | OUTPUT | BLOCKS OF FIG. 6-9 |
|---|---|---|---|---|---|---|---|---|---|---|---|---|---|---|---|---|
| 1 | | $a_1$ | $a_1$ | 1 | | | | 5 | | | | | $a_1$ | 1 | $a_1$ | 300-306,310-312 |
| 2 | $a_1$ | 5 | $a_1a_1$ | 2 | | | | | $a_1$ | $a_1$ | 1 | 2 | | | $a_1a_1$ | 313-316,319,410-415 |
| 3 | | | | | | | | | ($a_1$) | ($a_1$) | 2 | | $a_1$ | 2 | | 416 |
| 4 | 5 | 5 | | | $a_1a_1$ | 2 | | 6 | ($a_1$) | ($a_1$) | 3 | | $a_1$ | 3 | $a_1a_1$ | 417,419,313-316,318,380-383 |
| 5 | | | | | | | $a_1a_1a_1$ | | 5 | $a_1$ | 1 | 3 | | | | 384-389 |
| 6 | 5 | $b_1$ | $a_1a_1$ | 2 | | | $a_1a_1b_1$ | 7 | 5 | $b_1$ | 1 | 3 | | | | 390,392,394,395,313-315,317,360-366 |
| 7 | | | $b_1$ | 1 | | | | 8 | | | | | $b_1$ | 1 | $b_1$ | 367-369,371,330-332,310-312 |
| 8 | $b_1$ | $a_2$ | | | | | $b_1a_2$ | 9 | $b_1$ | $a_2$ | 1 | 2 | | | | 313-315,317,360-366 |
| 9 | | | $a_2$ | 1 | | | | | | | | | $a_2$ | 4 | $a_2$ | 367,369,371,330-332,310-312 |
| 10 | $a_2$ | 8 | | | $b_1a_2$ | 2 | $a_2b_1$ | 10 | ($b_1$) | ($a_2$) | 2 | | $b_1$ | 2 | $b_1a_2$ | 313-316,318,380-383 |
| 11 | | | | | | | | | $a_2$ | $b_1$ | 1 | 2 | | | | 384-389 |
| 12 | | | $b_1a_2$ | 2 | | | | | 8 | $b_1$ | 1 | 3 | | | | 390,392,394,395 |
| 13 | 8 | 10 | $b_1a_2b_1$ | 3 | | | | | (8) | ($b_1$) | 2 | | | | $b_1a_2b_1$ | 313-316,319,410-415 |
| 14 | | | | | | | | | ($b_1$) | ($a_2$) | 3 | | $b_1$ | 3 | | 416 |
| 15 | | | | | | | | | ($b_1$) | ($a_2$) | 3 | | | | | 416 |
| 16 | 10 | 9 | | | $a_2b_1$ | 2 | | 11 | ($a_2$) | ($b_1$) | 2 | | $a_2$ | 5 | $a_2b_1$ | 417,419,313-316,318,380-383 |
| 17 | | | | | | | $b_1a_2b_1a_2$ | | 10 | $a_2$ | 1 | 4 | | | | 384-389 |
| 18 | | | $a_2b_1$ | 2 | | | | 12 | | | | | | | | 390,393,394,395 |

*Figure 15A*

| | | | | | | | | | | | |
|---|---|---|---|---|---|---|---|---|---|---|---|
| 19 | 9 | $c_1$ | | | | | | | | | 313–315,317,360–366 |
| 20 | | | 1 | | 13 | | $c_1$ | 1 | | $c_1$ | 367,369,371,330–332,310–312 |
| 21 | $c_1$ | 12 | | | | (9) | $(c_1)$ | 2 | | | 313–316,318,380,381 |
| 22 | | | | $a_2b_1c_1$ | | $(a_2)$ | $(b_1)$ | 3 | | | 381–383 |
| 23 | | | 3 | | | c1 | a2 | 1 | | $a_2$ 6 | $a_2b_1c_1$ 384–389 |
| 24 | | $a_2b_1c_1$ | 3 | | $c_1a_2$ 14 | | | | | | 390,392,394,395 |
| 25 | 12 | $a_2b_1c_1a_2$ | 4 | | | 12 | $a_2$ | 1 | 4 | | $a_2b_1c_1a_2$ 313–316,319,410–415 |
| 26 | | | | | | (12) | $(a_2)$ | 2 | | | 416 |
| 27 | | | | | | (9) | $(c_1)$ | 3 | | a2 7 | 416 |
| 28 | | | | | | $(a_2)$ | $(b_1)$ | 4 | 2 | | 416 |
| 29 | 14 | $b_2$ | 1 | | $a_2b_1c_1a_2b_2$ 15 | | | | | $b_2$ 4 | 417,419,313–315,317,360–362,371, 330–332,310–312 |
| 30 | $b_2$ | $c_2$ | | | $b_2c_2$ | $b_2$ | $c_2$ | 1 | | | 313–315,317,360–366 |
| 31 | $c_2$ | | | | OVER FLOW | | | | 2 | $c_2$ | 367–369,371,330,331,350–352 |

| Fig. 15A |
|---|
| Fig. 15B |

INPUT COMPRESSED CODE STREAM
$a_1$ 5 5 $b_1$ $a_2$ 6 8 7 $c_1$ 9 10 $b_2$ $c_2$ $c_3$ $d_1$ 5 5 7 12 8 10 $b_3$ $b_4$ $d_2$

| ACTION | PREV CODE | CURR CODE | PREVIOUS STRING BUFFER | PRE STR CTR | CURMT STRING BUFFER | CUR STR CTR | EXTENDED STRING REGISTER | CODE CNTR | DICT CODE | DICT CHAR | HIT CTR | CHR CTR | SING CHAR TABLE | CTR | EXCL TBLS | CTR | OUTPUT | BLOCKS OF FIG. 6-9 |
|---|---|---|---|---|---|---|---|---|---|---|---|---|---|---|---|---|---|---|
| 1 |  | $a_1$ |  |  |  |  |  | 5 |  |  |  |  | $a_1$ | 1 |  |  | $a_1$ | 300–306,310–312 |
| 2 | $a_2$ | 5 | $a_1a_1$ | 2 |  |  |  |  | $a_1$ | $a_1$ | 1 | 2 |  |  |  |  | $a_1a_1$ | 313–316,319,410–415 |
| 3 |  |  |  |  |  |  |  |  |  |  |  |  |  |  |  |  |  | 416 |
| 4 | 5 | 5 |  |  | $a_1a_1$ | 2 |  | 6 | ($a_1$) | ($a_1$) | 2 |  | $a_1$ | 2 |  |  | $a_1a_1$ | 417,419,313–316,318,380–383 |
| 5 |  |  | $a_1a_1$ | 2 |  |  | $a_1a_1a_1$ |  | ($a_1$) | ($a_1$) | 3 |  | $a_1$ | 3 | aaa |  |  | 384–386,393–395 |
| 6 | 5 | $b_1$ | $b_1$ | 1 |  |  | $a_1a_1b_1$ |  |  |  |  |  | $b_1$ | 1 | aab | 1 | $b_1$ | 313–315,317,360–363,370,371,330–332,310–312 |
| 7 | $b_1$ | $a_2$ |  |  |  |  | $b_1a_2$ |  |  |  |  |  |  |  |  |  |  | 313–315,317,360–366 |
| 8 | $a_2$ | 6 | $a_2$ | 1 |  |  |  | 7 | $b_1$ | $a_2$ | 1 | 2 | $a_2$ | 4 |  |  | $a_2$ | 367,369,371,330–332,310–312 |
| 9 | 6 |  |  |  | $b_1a_2$ | 2 |  |  | ($b_1$) | ($a_2$) | 2 |  | $b_1$ | 2 |  |  | $b_1a_2$ | 313–316,318,380–383 |
| 10 |  |  |  |  |  |  | $a_2b_1$ | 8 | $a_2$ | $b_1$ | 1 | 2 |  |  |  |  |  | 384–389 |
| 11 |  |  | $b_1a_2$ | 2 |  |  |  |  |  |  |  |  |  |  |  |  |  | 390,392,394,395 |
| 12 | 6 | 8 | $b_1a_2b_1$ | 3 |  |  |  |  |  |  |  |  |  |  |  |  | $b_1a_2b_1$ | 313–316,319,410–415 |
| 13 |  |  |  |  |  |  |  |  | (6) | ($b_1$) | 2 |  |  |  |  |  |  | 416 |
| 14 |  |  |  |  |  |  |  |  | ($b_1$) | ($a_2$) | 3 |  | $b_1$ | 3 |  |  |  | 416 |
| 15 | 8 | 7 |  |  | $a_2b_1$ | 2 |  |  | ($a_2$) | ($b_1$) | 2 |  | $a_2$ | 5 |  |  | $a_2b_1$ | 417,419,313–316,318,380–383 |
| 16 |  |  | $a_2b_1$ | 2 |  |  | $b_1a_2b_1a_2$ |  |  |  |  |  |  |  | baba | 1 |  | 384–386,393–395 |
| 17 | 7 | $c_1$ |  |  |  |  | $a_2b_1c_1$ |  | 7 | $c_1$ | 1 | 3 |  |  |  |  |  | 313–315,317,360–366 |

*Figure 16A*

| | | | | | | | | | | | | | | | |
|---|---|---|---|---|---|---|---|---|---|---|---|---|---|---|---|
| 18 | | | | | | | | 10 | (7) | (a$_2$) | 2 | | | $c_1$ | 367,369,371,330-336 |
| 19 | 9 | a$_2$b$_1$c$_1$ | 3 | | | | | | (c$_1$) | (b$_1$) | 3 | | a$_2$ | 6 | a$_2$b$_1$c$_1$ | 336-338 |
| 20 | | a$_2$b$_1$c$_1$a$_2$ | 4 | | | | | | 9 | a$_2$ | 1 | 4 | | | a$_2$b$_1$c$_1$a$_2$ | 313-316,319,410-415 |
| 21 | | | | | | | | | (9) | (a$_2$) | 2 | | | | | 416 |
| 22 | | | | | | | | | (7) | (c$_1$) | 3 | | | | | 416 |
| 23 | | b$_2$ | 1 | | | | | | (a$_2$) | (b$_1$) | 4 | | a$_2$ | 7 | | 416 |
| 24 | 10 | | | | a$_2$b$_1$c$_1$a$_2$b$_2$ | | | 11 | | | | | b$_2$ | 4 | b$_2$ | 417,419,313-315,317,360-362,371, 330-332,310-312 |
| 25 | b$_2$ | | | | b$_2$c$_2$ | | | | | | | | | | | 313-315,317,360-363,370,371, 330-332 |
| 26 | c$_2$ | | | | | | | | | | | | | bc | | 333-335,330-332 |
| 27 | c$_3$ | | | | | | | | | | | | | c | 1 | c$_3$ | 333-335,330-332,310-312 |
| 28 | d$_1$ | d$_1$ | 1 | | | | | | (a$_1$) | (a$_1$) | 4 | | d$_1$ | 8 | d$_1$ | 313-316,318,380-383 |
| 29 | 5 | | | | | d$_1$a$_1$ | | | 12 | d$_1$ | a$_1$ | 1 | 2 | a$_1$ | | a$_1$a$_1$ | 384-389 |
| 30 | | a$_1$a$_1$ | 2 | | a$_1$a$_1$ | 2 | | | | | | | | | | 390,392,394,395 |
| 31 | 5 | | | | | a$_1$a$_1$a$_1$ | | | (a$_1$) | (a$_1$) | 5 | | a$_1$ | 9 | a$_1$a$_1$ | 313-316,318,380-383 |
| 32 | | a$_1$a$_1$ | 2 | | a$_1$a$_1$ | 2 | | | | | | | | aaa | 2 | | 384-386,393-395 |
| 33 | 5 | | | | | | | | (a$_2$) | (b$_1$) | 5 | | a$_2$ | 10 | a$_2$b$_1$ | 313-316,318,380-383 |
| 34 | | a$_2$b$_1$ | 2 | | a$_2$b$_1$ | 2 | | | | | | | | aaa | 3 | | 384-386,393-395 |
| 35 | 7 | | | | | a$_1$a$_1$a$_2$ | | | | 7 | a$_2$ | 1 | 3 | | | a$_2$b$_1$a$_2$ | 313-316,319,410-415 |
| 36 | 12 | a$_2$b$_1$a$_2$ | 3 | | | | | | (7) | (a$_2$) | 2 | | | | | 416 |

*Figure 16B*

| | | | | | | | | | | | | | |
|---|---|---|---|---|---|---|---|---|---|---|---|---|---|
| 37 | | | | | | | | | | | | | |
| 38 | 12 | 8 | | | | | | 13 | | | | | 417,419,313–316,318,380,381 |
| 39 | | | | $b_1a_2b_1$ | 3 | | | | | | $b_1$ | 5 | 381–383 |
| 40 | | | | | | $a_2b_1a_2b_1$ | | | | | | | | 384–389 |
| 41 | | | $b_1a_2b_1$ | 3 | | | 12 | 14 | $(b_1)$ | $(a_2)$ | $b_1$ | | 390,392,394,395 |
| 42 | 8 | 10 | | | | | | | (6) | $(b_1)$ | | | 313–316,318,380,381 |
| 43 | | | | | | | | | (7) | (c1) | | | 381 |
| 44 | | | $a_2b_1c_1a_2$ | 4 | | | | | $(a_2)$ | $(b_1)$ | $a_2$ | 12 | 381–383 |
| 45 | | | $a_2b_1c_1a_2$ | 4 | | $b_1a_2b_1a_2$ | | | | | | baba | 2 | 384–386,393–395 |
| 46 | 10 | $b_3$ | 1 | | | $a_2b_1c_1a_2b_3$ | | | | | $b_3$ | 6 | 313–315,317,360–362,371,330–332,310–312 |
| 47 | $b_3$ | $b_4$ | 1 | | | $b_3b_4$ | | | $b_3$ | $b_3$ | | | 313–315,317,360–366 |
| 48 | $b_4$ | | | | | $b_4d_2$ | | 15 | $b_4$ | $b_4$ | $b_4$ | 7 | 367,369,371,330–332,310–312 |
| 49 | | $d_2$ | | | | | | | | $d_2$ | | | 313–315,317,360–366 |
| 50 | | | | | | | | OVER FLOW | | | | | 367–369,371,330,331,350–352 |

| Fig. 16A |
|---|
| Fig. 16B |
| Fig. 16C |

DATA COMPRESSION AND DECOMPRESSION METHOD AND APPARATUS WITH EMBEDDED FILTERING OF DYNAMICALLY VARIABLE INFREQUENTLY ENCOUNTERED STRINGS

CROSS-REFERENCE TO RELATED APPLICATION

U.S. patent application Ser. No. 09/688,604, filed Oct. 16, 2000 relates to a data compression and decompression method and apparatus with embedded filtering of infrequently encountered strings. Said U.S. Pat. Ser. No. 09/688,604 is incorporated herein by reference.

BACKGROUND OF THE INVENTION

1. Field of the Invention

The invention relates to LZ data compression and decompression systems particularly with respect to preventing storage of infrequently encountered data character strings in the compressor and decompressor dictionaries. More particularly, the invention relates to dynamically adapting the strings to be excluded in accordance with the strings encountered in the input data.

2. Description of the Prior Art

Professors Abraham Lempel and Jacob Ziv provided the theoretical basis for LZ data compression and decompression systems that are in present day widespread usage. Two of their seminal papers appear in the IEEE Transactions on Information Theory, IT-23-3, May 1977, pp. 337–343 and in the IEEE Transactions on Information Theory, IT-24-5, September 1978, pp. 530–536. A ubiquitously used data compression and decompression system known as LZW, adopted as the standard for V.42 bis modem compression and decompression, is described in U.S. Pat. No. 4,558,302 by Welch, issued Dec. 10, 1985. LZW has been adopted as the compression and decompression standard used in the GIF image communication protocol and is utilized in the TIFF image communication protocol. GIF is a development of CompuServe Incorporated and the name GIF is a Service Mark thereof. A reference to the GIF specification is found in GRAPHICS INTERCHANGE FORMAT, Version 89a, Jul. 31, 1990. TIFF is a development of Aldus corporation and the name TIFF in a Trademark thereof. Reference to the TIFF specification is found in TIFF, Revision 6.0, Final—Jun. 3, 1992.

Further examples of LZ dictionary based compression and decompression systems are described in the following U.S. patents: U.S. Pat. No. 4,464,650 by Eastman et al., issued Aug. 7, 1984; U.S. Pat. No. 4,814,746 by Miller et al., issued Mar. 21, 1989; U.S. Pat. No. 4,876,541 by Storer, issued Oct. 24, 1989; U.S. Pat. No. 5,153,591 by Clark, issued Oct. 6, 1992; U.S. Pat. No. 5,373,290 by Lempel et al., issued Dec. 13, 1994; U.S. Pat. No. 5,838,264 by Cooper, issued Nov. 17, 1998; U.S. Pat. No. 5,861,827 by Welch et al., issued Jan. 19, 1999; and U.S. Pat. No. 5,951,623 by Reynar et al., issued Sep. 14, 1999.

In the above dictionary based LZ compression and decompression systems, the compressor and decompressor dictionaries may be initialized with all of the single character strings of the character alphabet. In some implementations, the single character strings are considered as recognized although not explicitly stored. In such systems the value of the single character may be utilized as its code and the first available code utilized for multiple character strings would have a value greater than the single character values. In this way the decompressor can distinguish between a single character string and a multiple character string and recover the characters thereof. For example, in the ASCII environment, the alphabet has an 8 bit character size supporting an alphabet of 256 characters. Thus, the characters have values of 0–255. The first available multiple character string code can, for example, be 258 where the codes 256 and 257 are utilized as control codes as is well known.

In the prior art dictionary based LZ compression and decompression systems, specific methodologies often require that the dictionary be limited to a fixed size. For example, in the GIF protocol, the dictionary is limited to a maximum of 4095 strings with a concomitant maximum code sine of 12 bits. When filled to maximum capacity, the dictionary may be frozen and utilized with the extant stored strings to perform further compression until such time as it is desirable to clear the dictionary contents.

During operation of the LZ methodology, the dictionary fills with data character strings and string fragments some of which may be only infrequently encountered. Thus, a number of the available codes may be occupied with string fragments that may only rarely, if ever again, be encountered. The codes so occupied would not significantly contribute to the compression of the input data character stream. Since as discussed above, the dictionary may be limited in size, the number of available codes occupied by these rarely encountered string fragments may be significant which, it is believed, would have an adverse effect on compression efficiency.

It is believed that excluding infrequently encountered strings from the dictionary would improve compression performance. It is further believed that no method or apparatus exists in the data compression/decompression art for specifically excluding infrequently encountered strings from being stored in the dictionary and occupying valuable dictionary codes. Said Ser. No. 09/688,604 discloses a data compression and decompression system that prevents infrequently occurring data character strings from occupying valuable codes in the compression and decompression dictionaries, the embodiments of which are described in terms of utilizing static exclusion tables.

In said U.S. Pat. No. 5,951,623, a pre-filled dictionary is used in combination with a data specific dictionary where the pre-filled dictionary is pre-loaded with commonly occurring character sequences. The data specific dictionary is utilized in the normal LZ compression mode and the longest match from either the pre-filled dictionary or the data specific dictionary is utilized as the compressed output. Extended strings are stored in the data specific dictionary. It is believed that rarely occurring character sequences may be entered into the data specific dictionary since these rarely occurring sequences have no counterpart in the pre-filled dictionary. Even though the pre-filled dictionary stores frequently occurring sequences, infrequently occurring sequences can still usurp valuable codes from the data specific dictionary.

It is an objective of the present invention to provide a data compression and decompression system that prevents infrequently occurring data character strings from occupying valuable codes in the compression and decompression dictionaries by utilizing dynamic exclusion tables that adapt to the input data statistics.

SUMMARY OF THE INVENTION

The system of the present invention includes a data compressor for compressing an input stream of data characters into an output stream of compressed codes. A dictionary stores strings of data characters encountered in the input stream, the stored strings having respective codes associated therewith. The input stream is searched by comparing the input stream to the stored strings to determine the longest match therewith. The code associated with the longest match is output so as to provide the output stream of compressed codes. An exclusion table is included for storing strings of data characters to be excluded from storage in the dictionary, An extended string is formed comprised of the longest match extended by the next data character in the input stream. If it is not in the exclusion table, the extended string is stored in the dictionary and a code is assigned thereto. If it is in the exclusion table, the extended string is not stored and the code remains available for another string. The number of times a string is encountered in the exclusion table is counted and the string is deleted from the exclusion table if the count exceeds a predetermined threshold. In this manner, the strings stored in the exclusion table adapt to the statistics of the input data.

Specifically, the input stream is compared to the strings stored in the dictionary until a mismatching input character occurs, thereby determining the longest match. The mismatching character is used to begin the next string search unless it is included in the exclusion table. If so, the mismatching character is outputted and further single input data characters are sequentially fetched and outputted until an input data character is fetched that is not in the exclusion table. This character is then used to begin the next string search. The number of times each such single data character is encountered in the exclusion table is counted and this single character string is deleted from the exclusion table if the count associated therewith exceeds a predetermined threshold. Again, in this manner, the strings stored in the exclusion table adapt to the statistics of the input data.

In addition to deleting strings from the exclusion table, counts are maintained of the number of times strings are matched in the dictionary. If the number of times that a string is matched in the dictionary is less than a predetermined threshold, the string is added to the exclusion table again providing an exclusion table that adapts to the statistics of the input data.

A data decompressor includes the same exclusion table as included in the compressor and utilizes the same exclusion table string deletion and addition criteria as utilized in the compressor. In this manner, the decompressor maintains the same strings stored in the exclusion table and in the dictionary as are stored in the compressor.

BRIEF DESCRIPTION OF THE DRAWINGS

FIG. 11, comprised of FIGS. 11A and 11B, is a chart exemplifying the operation of the compressor of FIG. 1 in accordance with the control flow chart of FIG. 4 and initially empty exclusion tables.

FIG. 13, comprised of FIGS. 13A and 13B is a chart exemplifying the operation of the compressor of FIG. 1 in accordance with the control flow chart of FIG. 4 and the exclusion tables of FIG. 12.

FIG. 15, comprised of FIGS. 15A and 15B is a chart exemplifying the operation of the decompressor of FIG. 5 in accordance with the control flow charts of FIGS. 6–9 and initially empty exclusion tables. The operation of the decompressor of FIG. 5 in accordance with the operational example chart of FIG. 15 also generates the exclusion tables of FIG. 12.

FIG. 16, comprised of FIGS. 16A and 16B is a chart exemplifying the operation of the decompressor of FIG. 5 in accordance with the control flow charts of FIGS. 6–9 and the exclusion tables of FIG. 12. The operation of the decompressor of FIG. 5 in accordance with the operational example chart of FIG. 16 also generates the exclusion tables of FIG. 14.

DESCRIPTION OF THE PREFERRED EMBODIMENTS

The best mode embodiments described below are predicated on the LZW methodology and utilize the implementation described above where the single character strings are considered as recognized by the compressor and decompressor although not explicitly initialized therein. The embodiments are modifications of the compression and decompression systems disclosed in said Ser. No. 09/688,604.

Figure 1:
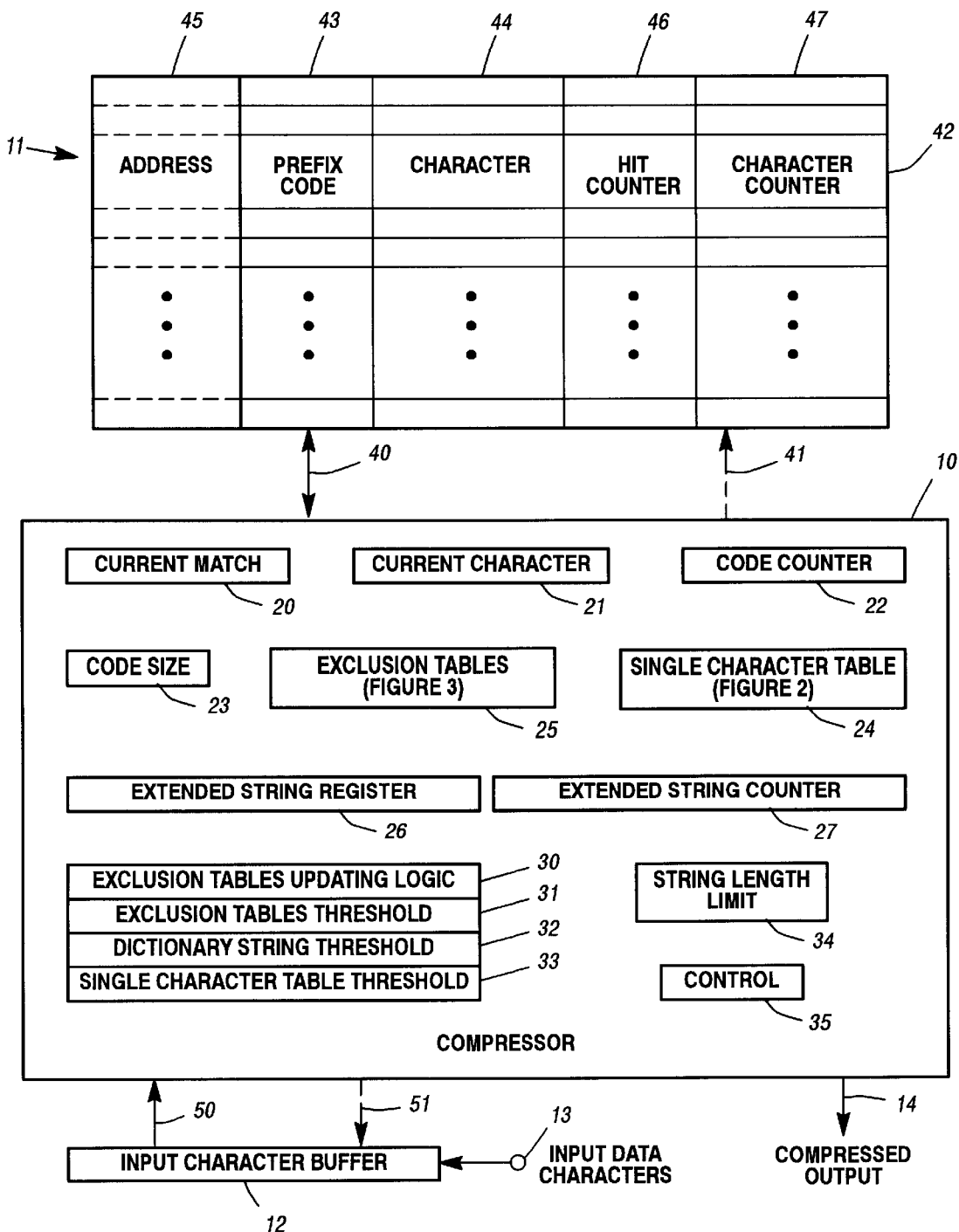
FIG. 1 is a schematic block diagram of a data compressor for compressing data in accordance with the present invention.

Referring to FIG. 1, a data compressor 10, together with a Dictionary 11 and an Input Character Buffer 12, compresses a stream of input data characters applied at an input 13 into a stream of corresponding compressed codes at an output 14.

The compressor 10 includes a Current Match register 20, a Current Character register 21, a Code Counter 22 and a Code Size register 23. The Code Counter 22 sequentially generates code values to be assigned to data character strings stored in the Dictionary 11 in a well known manner. The Code Size register 23 is utilized, as is well known, to control the number of bits utilized for transmitting the compressed codes from the output 14.

Figure 2:
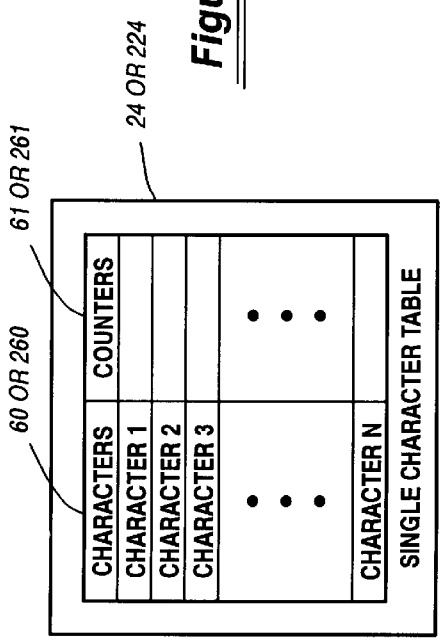
FIG. 2 is a data structure diagram illustrating details of the single character table utilized in the data compressor of FIG. 1 and the data decompressor of FIG. 5.
Figure 3:
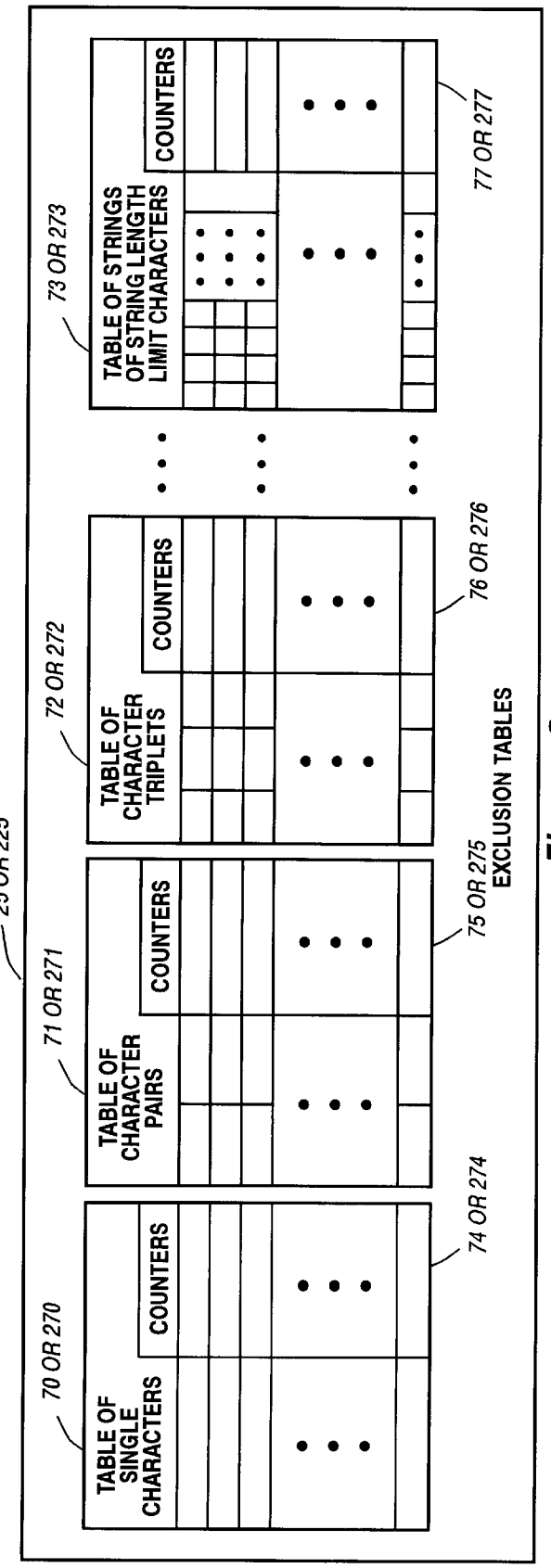
FIG. 3 is a data structure diagram illustrating details of the exclusion tables utilized in the data compressor of FIG. 1 and the data decompressor of FIG. 5.

The compressor 10 also includes a Single Character Table 24 for accumulating statistics with respect to single character strings encountered in the input data stream. Details of the Single Character Table 24 are illustrated in FIG. 2. Further included are Exclusion Tables 25 for storing data character strings to be excluded from storage in the Dictionary 11 and for accumulating statistics with respect to the excluded strings in a manner to be described. Details of the Exclusion Tables 25 are illustrated in FIG. 3. Also included in the compressor 10 is an Extended String register 26 for assembling an extended string. The Extended String register 26 is utilized to facilitate testing if the extended string is in the Exclusion Tables 25. An Extended String Counter 27 is included to provide a count of the number of characters in the extended string in the Extended String register 26. The character count is utilized to facilitate searching the Exclusion Tables 25 in a manner to be described.

Also included is exclusion tables update logic 30 for deleting strings from and adding strings to the Exclusion Tables 25 so that the strings maintained therein dynamically adapt to the statistics of the input data. The logic 30 operates, in a manner to be described, utilizing a predetermined Exclusion Tables Threshold parameter, a predetermined Dictionary String Threshold parameter and a predetermined Single Character Table Threshold parameter stored in registers 31–33, respectively.

The compressor 10 further includes a String Length Limit register 34 for storing a string length limit parameter indicating the maximum length string to be stored in the Dictionary 11. The compressor 10 additionally includes control 35 for controlling the operations of the compressor 10 in accordance with the operational flow chart of FIG. 4 to be described below.

The Dictionary 11 is included for storing data character strings in cooperation with the compressor 10. Data is communicated between the compressor 10 and the Dictionary 11 via a bi-directional data bus 40 under control of a control bus 41. The Dictionary 11 contains, for example, 4096 locations configured as indicated at reference numeral 42. A Dictionary location includes a Prefix Code field 43 and a Data Character field 44 and a location is accessed in the Dictionary 11 by an address 45. In a 4096 location dictionary, the address 45 is 12 bits wide. In a well known manner, a string is stored in the Dictionary 11 by storing the code of the string prefix in the Prefix Code field 43 and the string extension data character in the Data Character field 44 of the Dictionary location. For convenience, the address 45 of the location is utilized as the string code. The Dictionary 11 is conveniently configured and utilized as an associative memory for string searching and storage in the manner described in said U.S. Pat. No. 5,838,264. String searching and storage may also be effected by other arrangements, such as by hashing, as is well known in the art (e.g., see U.S. Pat. Nos. 4,558,302 and 5,861,827).

In a manner to be described below, the Dictionary 11 is utilized to accumulate statistics regarding the strings stored therein for the purpose of updating the Exclusion Tables 25. To perform this function, each location 42 of the Dictionary 11 includes a Hit Counter 46 and a Character Counter 47. The Hit Counter 46 maintains a count of the number of times the string with which the Hit Counter is associated is matched in the Dictionary 11. The Character Counter 47 stores a count of the number of characters comprising the string stored at the Dictionary location. Thus, the Hit Counters 46 accumulate statistics regarding the frequency with which the strings stored in the Dictionary 11 are matched by the input data character stream. If a string in the Dictionary 11 is only infrequently encountered, this string can be included in the Exclusion Tables 25 for subsequent exclusion from the Dictionary 11 in a manner to be described below. The Character Counters 47 are utilized to facilitate the update of the Exclusion Tables 25. Although the Hit Counters 46 and the Character Counters 47 are illustrated as part of the Dictionary 11, these counters may be maintained as separate arrays appropriately indexed to the Dictionary addresses 45.

The Input Character Buffer 12 buffers the input data character stream received at the input 13. The input data characters are applied from the Input Character Buffer 12 via a bus 50 to the Current Match register 20 and the Current Character register 21 in accordance with operations to be described. The compressor 10 controls acquiring input data characters from the Input Character Buffer 12 via a control bus 51.

Referring to FIG. 2, the Single Character Table 24 includes entries 60 for the respective characters of the alphabet over which data compression is performed and Counters 61 associated, respectively, with each of the characters. In a manner to be described, each of the Counters 61 is utilized to maintain a count of the number of times the character associated therewith is encountered in the input data character stream as a single character string not included in the Exclusion Tables 25. Although illustrated as an array included in the compressor 10, the Single Character Table 24 may alternatively be maintained in the Dictionary 11. Thus it is appreciated, that the Counters 61 accumulate statistics regarding the frequency of occurrence of the single character strings represented by the character entries 60. If a single character string that is not in the Exclusion Tables 25 is only infrequently encountered, this string is entered into the Exclusion Tables 25, in the Table 70, so that strings beginning with this character will thereafter be excluded from storage in the Dictionary 11.

Referring to FIG. 3, the Exclusion Tables 25 include a Table 70 for storing single character strings, a Table 71 for storing character pair strings, a Table 72 for storing character triplet strings, up to a Table 73 for storing strings having a number of characters equal to the string length limit stored in the String Length Limit register 34 of FIG. 1. It will be understood from the below described operation of the compressor 10 that a string stored in any of the Tables 70–73 will be excluded from storage in the Dictionary 11. It will furthermore become clear that no extension of a string stored in the Tables 70–73 will be stored in the Dictionary 11. Generally, no string longer than the string length limit in the String Length Limit register 34 (FIG. 1) will be stored in the Dictionary 11. Thus, the longest strings that are stored in the Exclusion Tables 25 are stored in the Table 73 and are of length equal to the string length limit.

Associated with the Tables 70–73 are respective Arrays of Counters 74–77. Each Counter in each Array maintains a count of the number of times the string with which the counter is associated is encountered in the associated one of the Exclusion Tables. Thus, the Counters 74–77 accumulate statistics regarding the frequency of occurrence of the strings stored in the Exclusion Tables 25. If a string to be excluded is encountered too frequently, the string is deleted from the Exclusion Tables 25 so that this string can, thereafter, be stored in the Dictionary 11. Although the Counters 74–77 are illustrated as part of the Exclusion Tables 25, these Counters can be maintained as separate arrays appropriately indexed to the strings in the Tables 70–73.

With continued reference to FIGS. 1–3, the operation of the compressor 10, briefly, is as follows. At an initializing point in the operation, the Code Counter 22 is set to the first available multiple character string code. Additionally, the Dictionary 11, the Current Match register 20, the Extended String register 26, the Extended String Counter 27, the Exclusion Table Counters 74–77 and the Single Character Table Counters 61 are cleared. A first input data character is fetched to the Current Match register 20 to initiate a compression cycle. At the beginning of a subsequent compression cycle, the Current Match register 20 is set to contain the mismatching character determined from the preceding compression cycle.

At the beginning of the cycle, the Exclusion Tables 25 are consulted to determine if the character in the Current Match register 20 is included in the Table 70 of single characters. If so, the Counter in the Counter Array 74 associated with the character is incremented by 1. The character is outputted and the next input data character is fetched to the Current Match register 20. This continues until the fetched character in the Current Match register 20 is not in the Exclusion Tables 25. The character in the Current Match register 20 is then shifted into the Extended String register 26 and 1 is added to the Extended String Counter 27. The corresponding Counter 61 in the Single Character Table 24 in aloe incremented by 1. The next input data character is then fetched to the Current Character register 21. This character is also shifted into the Extended String register 26 and the Extended String Counter 27 is again incremented by 1.

The Dictionary 11 is searched for the string represented by the current match concatenated with the current character. If the string is found in the Dictionary 11, the Hit Counter 46 associated with the matched string is incremented by 1. The string code thereof is loaded into the Current Match register 20 and the next input data character is fetched to the Current Character register 21. This character is also shifted into the Extended String register 26 and the Extended String Counter 27 is again incremented.

The search continues until the string represented by the contents of the current Match register 20 and the Current Character register 21 is not found in the Dictionary 11, the character in the Current Character register 21 comprising the mismatching character. In this manner, the input data character stream is matched against the strings in the Dictionary 11 until the longest match is determined with statistics of the frequency of occurrence of the matched strings being accumulated in the Hit Counters 46. The code of the longest matching string is output at the compressed output 14 from the Current Match register 20 utilizing the number of bits determined by the Code Size register 23.

The string not found in the Dictionary 11 is stored therein at the code assigned by the Code Counter 22 unless the character count in the Extended string Counter 27 is greater than the string length limit in the String Length Limit register 34 or the string is included in the Exclusion Tables 25. The Extended String register 26 and the Extended String Counter 27 facilitate the inquiry into the Exclusion Tables 25 since the character count in the Extended String Counter 27 indicates which of the Tables 70–73 should be consulted and the Extended String register 26 contains the extended string being tested. If the string length is not greater than the string length limit and the string is not in the Exclusion Tables 25, it is stored in the Dictionary 11 at the code assigned by the Code Counter 22 and the Code Counter 22 is incremented by 1. Additionally, the Hit counter 46 associated with the stored string is set to 1 and the Character Counter 47 associated with the stored string is set to the count in the Extended String Counter 27. In this manner, the Hit Counter 46 begins the accumulation of frequency of occurrence statistics for the stored string. The corresponding Character Counter 47 is set to the number of characters in the string to facilitate the Exclusion Tables update process to be described.

If the string is excluded either because of string length or inclusion in the Exclusion Tables 25, the Dictionary 11 is not updated and the Code Counter 22 is not incremented. If the string is excluded because of inclusion in the Exclusion Tables 25, the associated one of the counters 74–77 is incremented by 1 to accumulate frequency of occurrence statistics with respect to the string.

If the string is excluded from storage, the compression cycle is concluded by setting the Current Match register 20 to the character in the Current Character register 21. If, however, the string is stored in the Dictionary 11, a test is performed to determine if the Dictionary 11 is full. If the Dictionary is not full, the compression cycle is concluded by again setting the Current Match register 20 to the character in the Current Character register 21.

If the Dictionary is full, the Current Character is outputted and the Exclusion Tables 25 are updated by deleting strings therefrom and adding strings thereto in accordance with the statistics accumulated by the Single Character Table Counters 61, the Counters 74–77 of the Exclusion Tables 25 and the Hit Counters 46 of the Dictionary 11. Generally, a string that is frequently encountered in the Exclusion Tables 25 is deleted therefrom and a string that is infrequently encountered in the Dictionary 11 is added to the Exclusion Tables 25.

After updating the Exclusion Tables 25, control returns to the initialization point described above where appropriate resetting and clearing is performed.

Figure 4A:
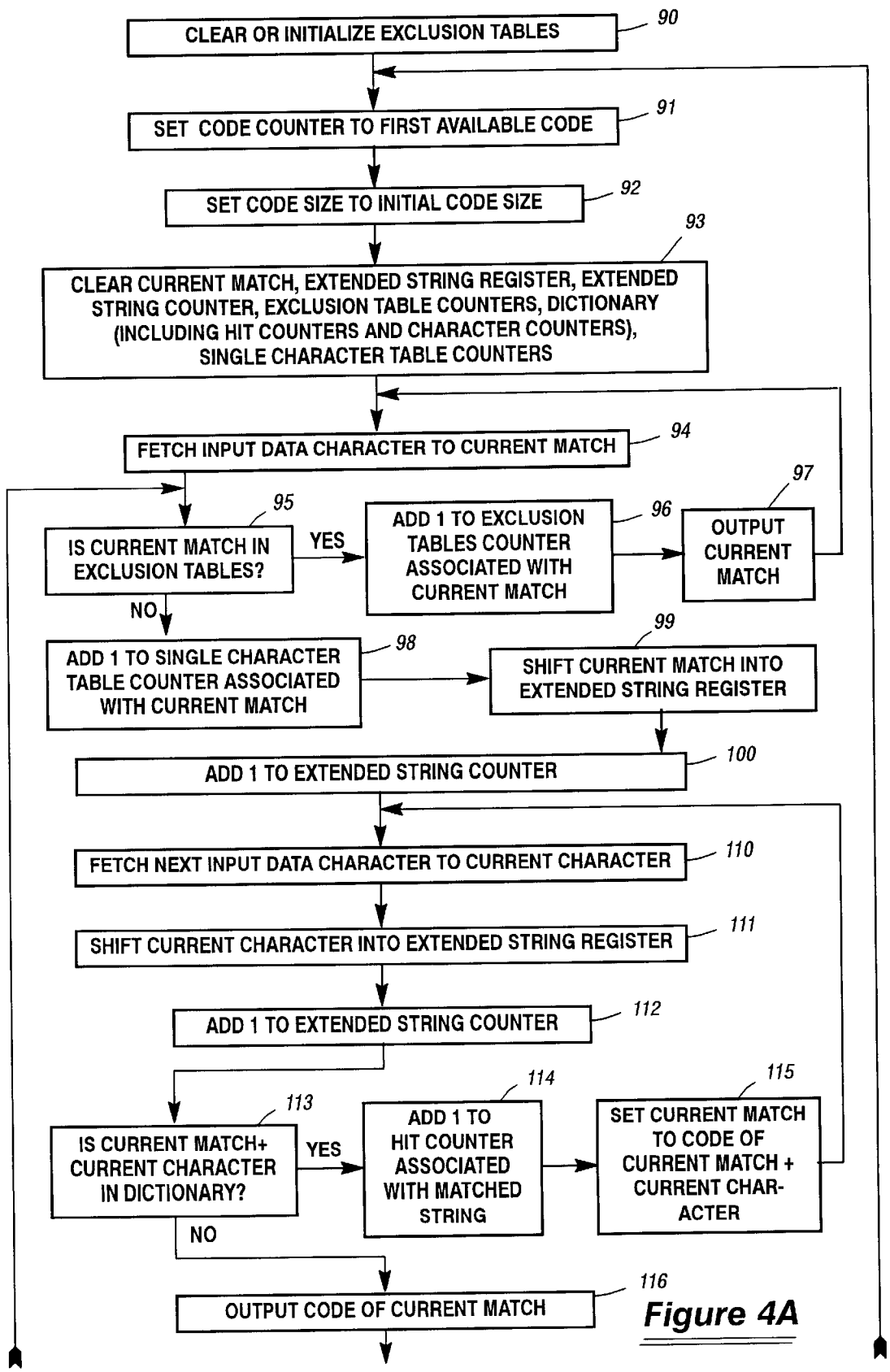
FIG. 4, comprised of FIGS. 4A and 4B, is a control flow chart illustrating the operations executed by the compressor of FIG. 1 so as to perform data compression in accordance with the present invention.
Figures 4, 4A, 4B:
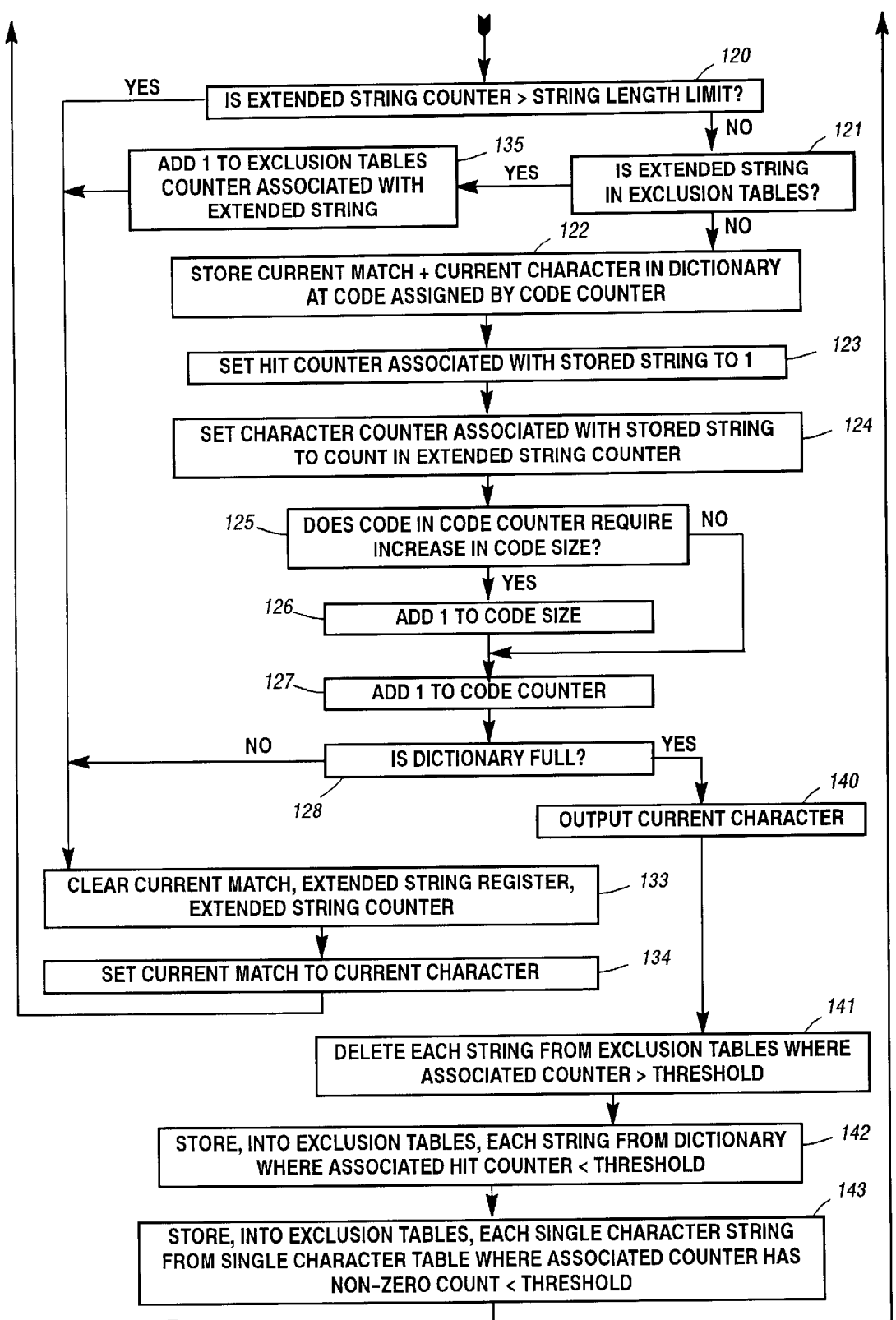

Referring to FIG. 4, with continued reference to FIGS. 1–3, a control flow chart is illustrated showing the detailed operations to be executed by the compressor 10. The control 35 of the compressor 10 is considered as containing appropriate circuitry such as state machines, or appropriate software, to control execution of the operations. The flow chart of FIG. 4 is predicated on a variable length output and the Code Size register 23 is utilized to this effect. In an ASCII variable length code implementation, the Code Size may begin with 9 bits and sequentially increase to 10, 11 and 12 bits at codes 512, 1024 and 2048, respectively.

The operation of the compressor 10 can begin either with cleared or initialized Exclusion Tables 25 in accordance with a block 90. If the Exclusion Tables 25 are initially cleared, the Tables 70–73 are initially empty of all strings. By the operations depicted in FIG. 4, the Exclusion Tables 25 are populated with strings based on statistics accumulated in the Dictionary 11 and Single Character Table 24.

Alternatively, an automatic procedure for populating the Exclusion Tables 25 with an initial get of strings is provided hereinbelow with respect to FIG. 17. This procedure for identifying infrequently encountered strings is a modification of the procedure described in said U.S. Pat. No. 5,951, 623 wherein frequently encountered strings are identified.

As a further alternative, the Exclusion Tables 25 may be initially manually populated by a practitioner in the art having knowledge of the string distribution statistics of the type of data being compressed. Useful information regarding English language statistics may be found in an article by Marcus et. al., "Building a Large Annotated Corpus of English: The Penn Treebank", Computational Linguistics, Vol. 19, No. 2, pp. 313–330 (1993), and in the book By. G. Zipf "Human Behavior and the Principle of Least Effort", 1949.

In whatever manner the block 90 is implemented, the operations of FIG. 4 dynamically adjust the contents of the Exclusion Tables 25 in accordance with the statistics of the input data.

Control proceeds to a block 91 whereat the Code Counter 22 is initialized to a first available code, for example, 258 in the ASCII environment. At a block 92, the Code Size register 23 is initialized to the beginning Code Size, for example, 9 bits in ASCII embodiments. At a block 93, the Current Match register 20, the Extended String register 26, the Extended String Counter 27, the Exclusion Table Counters 74–77, the Single Character Table Counters 61, and the Dictionary 11, including Hit Counters 46 and Character Counters 47, are cleared.

At a block 94, an input data character is fetched to the Current Match register 20. If processing entered the block 94 from the block 93, this is the first data character fetched from the input data character stream after performing the initial setting and clearing operations of the blocks 91–93. At a block 95, the Exclusion Tables 25 are consulted to determine if the character in the Current Match register 20 is included as a single character string to be excluded. Thus, at the block 95, it is only necessary to consult the Table 70 of single characters.

If the character in the Current Match register 20 is included in the Table 70, the YES branch from the block 95 is taken to a block 96. At the block 96, the Counter in the Counter Array 74 associated with the character is incremented by 1. Thus, at the block 96, statistics are accumulated with respect to the frequency of occurrence of single character strings encountered in the Exclusion Tables 25. Processing proceeds to a block 97 whereat the character in the Current Match register 20 is outputted from the Current Match register 20 at the compressed output 14 utilizing the number of bits designated by the Code Size register 23. Processing returns to the block 94 from the block 97 to fetch the next input data character to the Current Match register 20.

If, at the block 95, the character in the Current Match register 20 is not in the Exclusion Tables 25, the NO branch from the block 95 is taken to a block 98. At the block 98, the Counter 61 in the Single Character Table 24 associated with the character in the Current Match register 20 is incremented by 1. In this manner statistics are accumulated with respect to the single character strings that are encountered in the input data character stream and are not excluded by the Exclusion Tables 25. Thereafter, at a block 99, the character in the Current Match register 20 is shifted into the Extended String register 26 and, at a block 100, the count in the Extended String Counter 27 is incremented by 1.

At a block 110, the next input data character is fetched to the Current Character register 21. At a block 111, the character in the Current Character register 21 is shifted into the Extended String register 26 and, at a block 112, the count in the Extended String Counter 27 is incremented by 1. It is appreciated that as the characters of a string are being fetched from the input data character stream at the block 110, the characters of the string are entered into the Extended string register 26 and are counted by the Extended String Counter 27 in order to facilitate the string processing to be described.

Processing continues at a block 113 whereat the Dictionary 11 is searched to determine if the string corresponding to the code in the Current Match register age 20 concatenated by the character in the Current Character register 21 is in the Dictionary 11. Dictionary searching procedures are well known in the art for performing the function of the block 113 (e.g., see said U.S. Pat. Nos. 4,558,302; 5,838,264 or 5,861,827). In particular, the Dictionary 11 may be searched associatively as described in said U.S. Pat. No. 5,838,264. The string is in the Dictionary 11 if the Prefix Code 43 and Character 44 of a Dictionary location matches the code in the Current Match register 20 and the character in the Current Character register 21, respectively. The Address 45 of the location provides the code of the matched string.

If, at the block 113, the string is found in the Dictionary 11, the YES branch from the block 113 is taken to a block 114. At block 114, the Hit Counter 46 associated with the matched string is incremented by 1. Since the Address 45 of the matched string has been located in the Dictionary 11, the associated Hit Counter 46 is readily accessed and incremented. In this manner, the Hit Counters 46 accumulate statistics with respect to the frequency of occurrence of the matched strings. Control proceeds to a block 115 whereat the contents of the Current Match register 20 is updated to contain the code of the string that was found. Specifically, the string code Address 45 of the Dictionary location at which the string was found is entered into the Current Match register 20. After updating the Current Match register 20 with the code of the currently matched string, control returns to the block 110 to fetch the next input data character to the Current Character register 21. Processing continues with the blocks 111 and 112 as described above where the currently fetched character is shifted into the Extended String register 26 and the Extended String Counter 27 is incremented by 1.

In this manner, the loop formed by the blocks 110–115 compares the input data character stream with the strings stored in the Dictionary 11 to find the longest match therewith. The input data character string being extended, and searched in the Dictionary 11, continues to be extended and stored in the Extended String register 26 while the count of the number of characters in the string is maintained in the Extended String Counter 27. Additionally, as the strings are extended and matched, the associated Hit Counters 46 continue to maintain the statistics thereof.

At the block 113, when the concatenation of the currently matched string with the next character fetched at the block 110 results in an extended string that is not in the Dictionary 11, the NO branch from the block 113 is taken to a block 116. At the block 116, the code of the Current Match is output as part of the compressed code stream provided at the compressor output 14. The code of the Current Match is provided by the Current Match register 20 and is output utilizing the number of bits denoted by the Code Size register 23. When Current Match is a multiple character string, the code of the string resides in the Current Match register 20 and was the longest match found in the Dictionary 11 as described above with respect to the block 113. It is appreciated that the Current Match that is output at the block 116 can also be a single character. The output code in this case is the value of the character which is also provided from the Current Match register 20.

Processing proceeds to a block 120 whereat the character count in the Extended String Counter 27 is compared to the string length limit in the String Length Limit register 34 to determine If the character count of the extended string that was not found in the Dictionary 11 at the block 113 is greater than the string length limit. The test of block 120 is performed so that extended strings that might otherwise have been stored in the Dictionary 11 can be excluded therefrom if the string is longer than a predetermined length. This feature is included in the preferred embodiment of the present invention because of the observation that strings of non-repetitive characters greater than a certain length tend not to be repeated depending on the statistics of the data, the size of the alphabet and the size of the Dictionary. For example, it has been observed in the GIF environment where a limited size dictionary is utilized, that with a 256 character alphabet and non-repetitive data, strings of approximately four or five characters are rarely repeated.

Thus, strings greater than the String length limit may be excluded from storage in the Dictionary 11 because such strings may be only infrequently, if ever again, encountered. In this manner, string codes assigned by the Code Counter 22 are prevented from being usurped by such infrequently encountered strings.

Optionally, the present invention may be implemented without utilizing the feature represented by the block 120. If it is desired so to do, the block 120 would be eliminated. Furthermore, the string length limitation may be bypassed if a repeating character run is occurring in the input data character stream. This embodiment modification will be described with respect to FIGS. 18 and 19.

If at the block 120, the character count of the extended string is not greater than the string length limit, the NO branch is taken from the block 120 to a block 121. At the block 121, the Exclusion Tables 25 are consulted to determine if the string in the Extended String register 26 is included therein. The appropriate one of the Tables 70–73 is consulted depending on the character count in the Extended String Counter 27. If, for example, the Extended String Counter 27 indicates that the extended string in the Extended String register 26 is comprised of three characters, the Table 72 of character triplets is consulted. If the extended string in the Extended String register 26 is not included in the Exclusion Tables 25, the No branch from the block 121 is taken to a block 122.

As discussed above, the string in the Extended String register 26 is the extended string that was not found in the Dictionary 11 at the block 113. At the block 122, this extended string is entered into the Dictionary 11 and the extant code of the Code Counter 22 is assigned to this stored extended string. Details of specific implementations for the function of the block 122 are well known (e.g. see said U.S. Pat. Nos. 4,558,302; 5,838,264 or 5,861,827). Specifically, in the preferred embodiment disclosed herein, the code in the Current Match register 20 and the character in the Current Character register 21 are entered into the Prefix Code field 43 and the Character field 44, respectively, of the Dictionary location addressed by the extant code in the Code Counter 22. It will be appreciated that the extended string is entered into the next empty location of the Dictionary 11. Pursuant to the operation of the compressor 10 described herein, the value in the Current Match register 20 stored into the Prefix Code field 43 can either be a single character value or a multiple character string code.

Control proceeds to a block 123 whereat the Hit Counter 46 associated with the stored string is set to 1. As discussed above, this Hit Counter 46 accumulates frequency of occurrence statistics with respect to the associated stored string.

At a block 124, the Character Counter 47 associated with the stored string is set to the count in the Extended String Counter 27. Thus, the associated Character Counter 47 is set to the number of characters comprising the stored extended string. The Character Counter 47 is utilized to facilitate updating the Exclusion Tables 25 in a manner to be described.

Processing then proceeds to a block 125 whereat the code in the Code Counter 22 is tested to determine if an increase in code size is required. If so, processing continues to a block 126 whereat the Code Size register 23 is incremented by 1. If an increase in Code Size is not required at the block 125, the block 126 is bypassed to continue processing at a block 127. At block 127, the Code Counter 22 is incremented by 1. At a block 128, a test is performed to determine if the Dictionary 11 is full. This test is conveniently performed by checking the overflow output of the Code Counter 22 to determine if the Code Counter 22 has overflowed as the result of the incrementation at the block 127.

If at the block 128 the Dictionary 11 is not full, the NO branch from the block 128 is taken to a block 133. At the block 133, the Current Match register 20, the Extended String register 26 and the Extended String Counter 27 are cleared. At a block 134, the character in the Current Character register 21 is set into the Current Match register 20. Thus, the Current Match register 20 is set with the character that resulted in the mismatch at the block 113. This character is utilized to begin the next compression cycle and, accordingly, control returns to the block 95.

If at the block 120, the character count of the extended string is greater than the string length limit or if, at the block 121, the extended string in the Extended String register 26 is included in the Exclusion Tables 25, the associated YES branch is taken from the block 120 or from the block 121, through a block 135, directly to the block 133 to bypass the processing of the blocks 122–128. When this occurs, the extended string is not stored in the Dictionary 11 and the Code Counter 22 is not incremented.

When the extended string is included in the Exclusion Tables 25, the YES branch from the block 121 is taken to the block 135. At the block 135, the appropriate Counter in the Counter Arrays 74–77 associated with the extended string is incremented by 1. Thus, statistics are accumulated with respect to the frequency of encountering the extended string in the Exclusion Tables 25. As previously discussed, control proceeds from the block 135 to the block 133.

It is appreciated from the above that whether the extended string is stored in or excluded from the Dictionary 11, processing continues at the block 133 when the Dictionary 11 is not full, as described above.

At the block 128, when the Dictionary 11 is determined to be full, the YES branch from the block 128 is taken to a block 140. At the block 140, the character in the Current Character register 21 is outputted at the compressed output 14 utilizing the number of bits designated by the Code Size register 23. Control proceeds to a block 141 whereat the Exclusion Tables 25 are updated by deleting each string from the Exclusion Tables 25 where the associated Counter in the Counter Arrays 74–77 is greater than the Exclusion Tables Threshold in the register 31. The Exclusion Tables Threshold is selected so that frequently encountered strings will be deleted from the Tables 70–73 of the Exclusion Tables 25. Thus, in subsequent operations of the compressor 10, the strings that are deleted from the Exclusion Tables 25 at the block 141 can be stored in the Dictionary 11 when encountered in the input data character stream.

Processing proceeds to a block 142 whereat strings are stored from the Dictionary 11 into the Exclusion Tables 25 where the Hit Counters 46 associated with these Dictionary strings are less than the Dictionary String Threshold in the register 32. The Dictionary String Threshold is selected so that strings that were only infrequently matched in the Dictionary 11 can be set into the Exclusion Tables 25 so that in subsequent operations of the compressor 10 these strings will be excluded from Dictionary storage. The Character Counters 47 are utilized to facilitate the function of the block 142 in identifying the appropriate Table 70–73 in which to store a string.

Procedures for extracting the characters of the string from the Dictionary 11 for storage in the Exclusion Tables 25 are well known (e.g., see said U.S. Pat. Nos. 4,558,302; 5,838,264 or 5,861,827). Briefly, the character in the Character field 44 of the accessed Dictionary location is saved and the code in the Prefix Code field 43 of the location is utilized to again access the Dictionary 11. The character is saved from this accessed location and the Prefix Code thereof provides the next Dictionary location to access in this backward trace of the string. When the Prefix Code is equal to a character value, all of the characters of the string have been recovered for storage in the appropriate Table 70–73 of the Exclusion Tables 25.

Control proceeds to a block 143 whereat selected single character strings from the Single Character Table 24 are stored into Table 70 of the Exclusion Tables 25. A string is selected where the associated Counter 61 has a non-zero count less than the Single Character Table Threshold in the register 33. Thus, in a manner similar to that discussed with respect to the block 142, single character strings that were only infrequently encountered can be stored in the Exclusion Tables 25 so that strings beginning with such single characters can be excluded from Dictionary storage in subsequent operations of the compressor 10.

Since the Single Character Table 24 includes an entry for each of the alphabet characters, only the non-zero counts are utilized in performing the functionality of the block 143. Alternatively, the Single aft Character Table 24 may be arranged so that only single characters that are actually encountered are counted therein. With this alternative arrangement, the entire Single Character Table 24 would be cleared at the block 93. It is appreciated with respect to the blocks 142 and 143 that the strings entered into the Exclusion Tables 25 are not already stored therein since these strings were not excluded strings in the processing of the compressor 10 described above.

After updating the Exclusion Tables 25 at the block 141–143, control returns to the block 91 to begin appropriate resetting and clearing prior to beginning a further cycle of selectively filling the Dictionary 11 with strings.

Although the blocks 141–143 perform updating of the Exclusion Tables 25 pursuant to the Dictionary 11 being filled with strings, it is appreciated that other embodiments may be utilized in practicing the invention. For example, strings may be deleted from the Exclusion Tables 25 "on the fly" whenever the Counter associated with a string exceeds the Exclusion Tables Threshold 31. Similarly, strings may be transferred from the Dictionary 11 to the Exclusion Tables 25 at a predetermined point prior to the Dictionary becoming full.

If, at the block 90, the operations begin with cleared Exclusion Tables, the block 141 can be bypassed during the first iteration through the flow chart of FIG. 4 since the Exclusion Tables 25 will be empty when processing first enters the block 141. Although the blocks 141–143 describe both deleting strings from and adding strings to the Exclusion Tables 25, it is appreciated that the invention can also be practiced where only one of the updating operations is performed with respect to the Exclusion Tables 25.

If, at the blocks 142 and 143, one or more of the Tables 70–73 are full, an appropriate string deletion strategy can be utilized prior to performing the functions of the blocks 142 and 143. For example, strings can be deleted that had been entered into the Exclusion Tables 25 but had not thereafter been encountered in subsequent is processing of the compressor 10. The Counters 74–77 associated with such strings would have zero counts therein.

It is appreciated that the blocks 91, 92, 94, 110 113, 115, 116, 122, 125–127 and 134 depict the underlying LZW data compression processing of FIG. 4. Thus, any known implementation of LZW data compression can be utilized in implementing these LZW data compression aspects.

Figure 5:
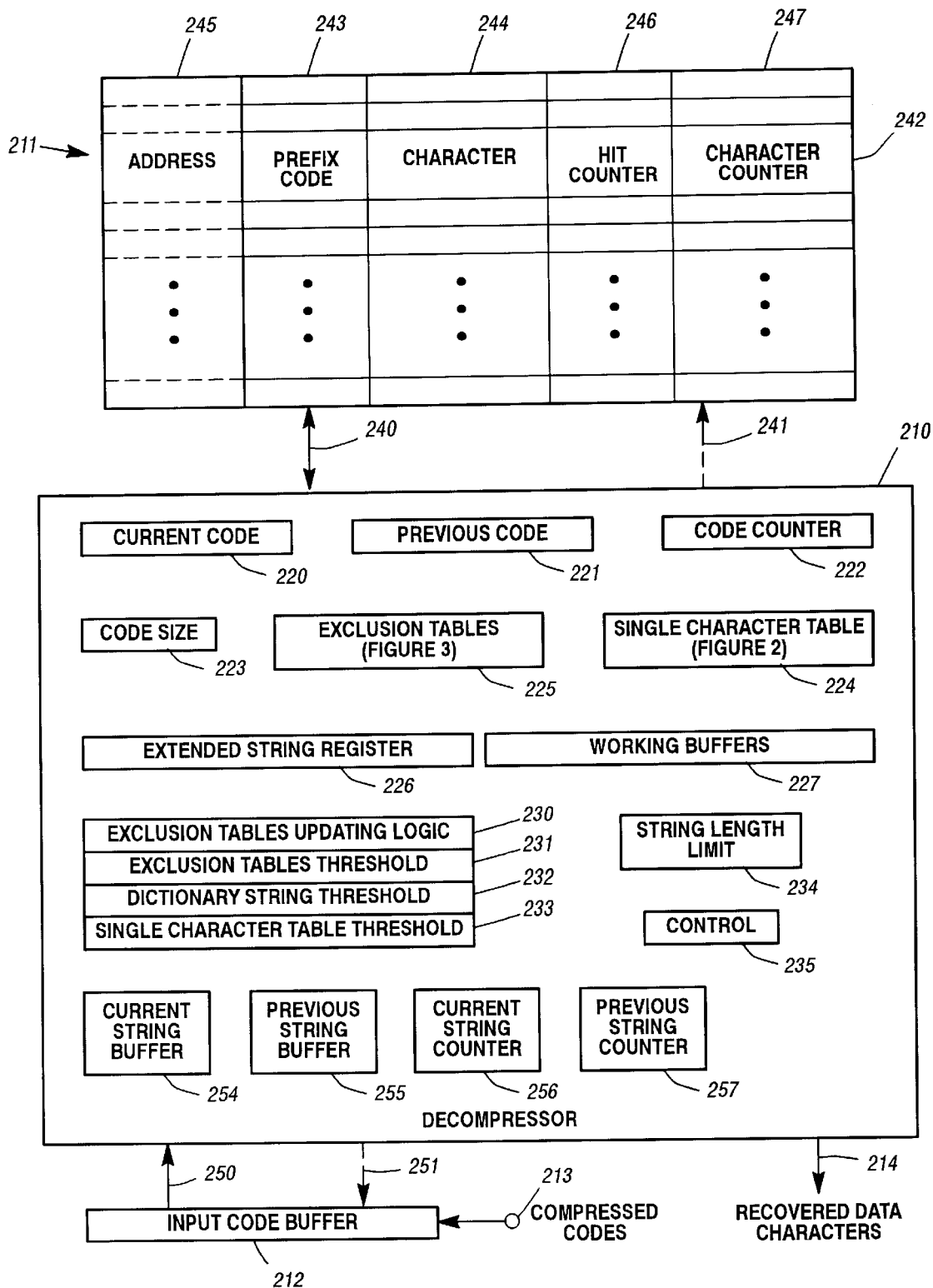
FIG. 5 is a schematic block diagram of a data decompressor embodied in accordance with the present invention for recovering data compressed by the compressor of FIG. 1.

Referring to FIG. 5, with continued reference to FIGS. 1–3, a data decompressor 210, together with a Dictionary 211 and an Input Code Buffer 212, decompresses a stream of compressed codes applied at an input 213 into a recovered stream of data characters at an output 214. It is appreciated that the compressed code stream from the output 14 of the compressor 10 (FIG. 1), if applied to the input 213 of the decompressor 210, results in the recovery, at the output 214 of the decompressor 210, of the original input data character stream applied to the input 13 of the compressor 10.

The decompressor 210 includes a Current Code register 220, a Previous Code register 221, a Code Counter 222 and a Code Size register 223. The Code Size register 223 performs a similar function to that described above with respect to the Code Size register 23 of the compressor 10 in that the Code size register 223 determines the number of bits in which the decompressor 210 receives the input compressed codes. The Code Counter 222 sequentially generates code values to be assigned to extended strings stored in the Dictionary 211 by the decompressor 210 and used to process incoming compressed codes in a manner to be described. It is appreciated from the descriptions below that the Code Counter 222 maintains a lock-step relationship with the Code Counter 22 of the compressor 10 of FIG. 1.

The decompressor 210 also includes a Single Character Table 224 identical to the Single Character Table 24 discussed above with respect to FIGS. 1 and 2. The character array 60 and Counters 61 discussed above with respect to FIG. 2, are denoted as character array 260 and Counters 261 with respect to the Single Character Table 224 of the decompressor 210. In a manner to be described, the decompressor 210 accumulates the same statistics with respect to single character strings as are accumulated by the compressor 10 in the Single Character Table 24.

The decompressor 210 further includes Exclusion Tables 225 identical to the Exclusion Tables 25 described above with respect to FIGS. 1 and 3. The Tables 70–73 and the Counters 74–77 discussed above with respect to FIG. 3, are denoted as Tables 270–273 and Counters 274–277 with respect to the Exclusion Tables 225 of the decompressor 210. In a manner to be described, the decompressor 210 stores the same strings and accumulates the same statistics in the Exclusion Tables 225 as are stored and accumulated in the Exclusion Tables 25 by the compressor 10.

Also included in the decompressor 210 is an Extended String register 226 for assembling an extended string. The Extended String register 226 is utilized to facilitate determining if the extended string is in the Exclusion Tables 225 in a manner similar to that described above with respect to the Extended String register 26 of the compressor 10. The decompressor 210 further includes a String Length Limit register 234 for storing a string length limit parameter indicating the maximum length string to be stored in the Dictionary 211. The String Length Limit register 234 is utilized in the decompressor 210 in the manner described above with respect to the String Length Limit register 34 of the compressor 10. The above descriptions with respect to the optional string length limitation feature of the compressor 10 also apply to the string length limitation feature as utilized in the decompressor 210 in a manner to be further described.

Also included is exclusion tables update logic 230 which utilizes a predetermined Exclusion Tables Threshold, a predetermined Dictionary String Threshold and a predetermined Single Character Table Threshold parameter stored in registers 231–233 respectively. The logic 230 and registers 231–233 are identical to the logic 30 and the registers 31–33 described above with respect to FIG. 1. The exclusion tables update logic 230 is included in the decompressor 210 for deleting strings from and adding strings to the Exclusion Tables 225 so that the strings stored therein are maintained identical to the strings stored in the Exclusion Tables 25 by the compressor 10 in a manner to be described.

The decompressor 210 also includes a Current String Buffer 254 and a Current String Counter 256. The Current String Buffer 254 holds the characters of the string corresponding to Current Code and the Current String Counter 256 provides a count of the number of characters in the string corresponding to Current Code. Additionally, the decompressor 210 includes a Previous String Buffer 255 and a Previous String Counter 257. At the end of a decompression cycle, in accordance with the descriptions below, the contents of the Current String Buffer 254 and the Current String Counter 256 are, when appropriate, transferred to the Previous String Buffer 255 and the Previous String Counter 257, respectively, so that previous string information is available in the next decompression cycle.

The decompressor 210 further includes Working Buffers 227 for assembling strings for processing and outputting in a manner to be described. Also included is control 219 for controlling the operations of the decompressor 210 in accordance with the operational flow charts of FIGS. 6–9.

The Dictionary 211 is configured and utilized for string storage and searching identically in the manner of the Dictionary 11 described above with respect to FIG. 1. The Dictionary 211, in cooperation with the decompressor 210 stores data character strings corresponding to received compressed code inputs and accumulates statistics regarding the strings stored therein in the same manner described above with respect to FIG. 1 for the Dictionary 11. Data is communicated between the decompressor 210 and the Dictionary 211 via a bi-directional data bus 240 under control of a control bus 241. In the operation of the decompressor 211, the contents of the Dictionary 211 are maintained identical to the contents of the Dictionary 11 of the compressor 10 of FIG. 1. The descriptions given above with respect to the elements 42–47 of the Dictionary 11 also apply to the elements 242–247, respectively, of the Dictionary 211. In a manner to be described, the decompressor 210 accumulates the same statistics in the Hit Counters 246 and Character Counters 247 as are accumulated by the compressor 10 in the Hit Counters 46 and Character Counters 47.

The Input Code Buffer 212 buffers the input compressed codes received at the input 213. The individual input codes are applied from the Input Code Buffer 212, via a bus 250, to the Current Code register 220 in accordance with operations to be described. The decompressor 210 controls acquiring input codes from the Input Code Buffer 212 via a control bus 251.

With continued reference to FIGS. 2, 3 and 5, the operation of the decompressor 210 will be briefly described. Throughout the operation, the Hit Counters 246 of the Dictionary 211, the Counter Arrays 274–277 of the Exclusion Tables 225 and the Counters 261 of the Single Character Table 224 accumulate the same statistics as, and in lock step with, the corresponding Counters described above with respect to the compressor 10. At an initializing point in the operation, the Code Counter 222 is set to the same first available multiple character string code to which the Code Counter 22 of the compressor 10 is initially set. Additionally, the Dictionary 211, the Current Code register 220, the Previous Code register 221, the Previous String Buffer 255, the Exclusion Table Counters 274–277 and the Single Character Table Counters 261 are cleared.

The decompressor 210 provides initial Previous Code information by initially fetching and outputting the first input code. By the operation of the compressor 10 described above, it is appreciated that the first input code represents a single character and the Exclusion Tables 225 are consulted to determine if the character is included therein. If so, at least the next input code will again represent a single character. Accordingly, input codes are fetched and the characters represented thereby are outputted. The first such code representing a character not in the Exclusion Tables 225 is set into the Previous Code register 221. The code fetching to the Current Code register 220 utilizes the number of bits determined by the Code Size in the Code Size register 223. For each such fetched character that is included in the Exclusion Tables 225, the Counter of the Exclusion Tables Counter Array 274 associated with the character is incremented by 1. For the first such character not in the Exclusion Tables 225, the Counter of the Single Character Table Counters 261 associated with the character is incremented by 1.

The decompression cycle begins by the decompressor 210 fetching the next input code to the Current Code register 220 again utilizing the number of bits determined by the Code Size. The fetched code is examined to determine if it is equal to a character value, greater than the character values but less than the code in the Code Counter 222, or not less than the code in the Code Counter 222.

If the Current Code is greater than the character values and less than the code in the Code Counter 222, the Current Code represents a multiple character string contained in the Dictionary 211. The characters of the string corresponding to Current Code are recovered and output. The Hit Counters 246 associated with the string and with each stored multi-character prefix string thereof are incremented by 1. Additionally, the Counter of the Single Character Table Counters 261 associated with the first character of the recovered string is incremented by 1.

The string corresponding to Previous Code is concatenated with the first character of the string corresponding to Current Code to form an extended string. If the extended string length is not greater than the string length limit and the extended string is not in the Exclusion Tables 225, the extended string is stored in the Dictionary 211 at the code assigned by the Code Counter 222. The Code Counter 222 is then incremented. The Hit Counter 246 associated with the stored string is incremented by 1. If the extended string length exceeds the string length limit or the extended string is included in the Exclusion Tables 225, the extended string is not stored and the Code Counter 222 is not incremented. If the extended string is included in the Exclusion Tables 225, the Counter of the Exclusion Tables Counter Arrays 275–277 associated with the extended string is incremented by 1. The decompression cycle is concluded by setting Previous Code to Current Code.

If the fetched Current Code is not less than the code in the Code Counter 222, the fetched Current Code represents a string that is stored in the Dictionary 11 (FIG. 1) but is not yet stored in the Dictionary 211. It is appreciated that in the decompressor embodiment described herein, the fetched Current Code will be equal to the Code Counter 222. When this occurs, exception case processing similar to that described in said U.S. Pat. No. 4,558,302 is utilized triefly, the string corresponding to Previous Code is extended by the first character thereof and the characters of the extended string are output. The extended string is stored in the Dictionary 211 at the code assigned by the Code Counter 222. The Code Counter 222 is incremented by 1 and the Hit Counter 246 associated with the stored string is incremented by 1. This extended string that is output and stored is the string corresponding to Current Code.

The string corresponding to Current Code is then traced in the Dictionary 211 and the Hit Counters 246 associated with the string and with each stored multi-character prefix string thereof are incremented by 1. Additionally, the Counter of the Single Character Table Counters 261 associated with the first character of the string is incremented by 1. The decompression cycle is concluded by setting Previous Code to Current Code.

If the input Current Code is equal to a character value, the character is outputted. An extended string is formed by concatenating the string corresponding to Previous Code with the character corresponding to Current Code. If the extended string length does not exceed the string length limit and the extended string is not in the Exclusion Tables 225, the extended string is stored in the Dictionary 211 at the code assigned by the Code Counter 222. The Code Counter 222 is then incremented by 1. The Hit Counter 246 associated with the stored string is incremented by 1. If the length of the extended string exceeds the string length limit or if the extended string is included in the Exclusion Tables 225, the extended string is not stored in the Dictionary 211 and the Code Counter 222 is not incremented. If the extended string is included in the Exclusion Tables 225, the Counter of the Counter Arrays 274–277 associated with the extended string is incremented by 1.

A test is-performed to determine if the Dictionary 211 is full. If the Dictionary is not full, the Exclusion Tables 225 are then consulted to determine if the character corresponding to Current Code is included therein. If not, the decompression cycle concludes by setting Previous Code to Current Code. The Counter of the Single Character Table Counters 261 associated with the character is incremented by 1.

If the character corresponding to Current Code is in the Exclusion Tables 225, the Counter in the Counter Array 274 associated with the character corresponding to Current Code is incremented by 1. At this point the decompressor 210 generates new Previous Code information in a manner similar to that described above by fetching and outputting consecutive input codes that represent single characters which are included in the Exclusion Tables 225. For each such character, the associated Counter in the Counter Array 274 is incremented by 1. When a code is fetched that represents a single character string that is not in the Exclusion Tables or that represents a multiple character string, the string corresponding to this fetched Current Code is utilized to provide the new Previous Code information. The string character or characters are outputted and Previous Code is set to the Current Code. If the fetched code represents a single character string that is not in the Exclusion Tables, the associated Counter 261 in the Single Character Table 224 is incremented by 1. If the fetched code represents a multiple character string, the Hit Counters 246 in the Dictionary 211 associated with the string and with each stored multi-character prefix string thereof are incremented by 1. Additionally, the Single Character Table Counter 261 associated with the first character of the string is incremented by 1.

If the Dictionary 211 is full, the Exclusion Tables 225 are updated by deleting strings therefrom and adding strings thereto in accordance with the statistics accumulated by the Single Character Table Counters 261, the Counters 274–277 of the Exclusion Tables 225 and the Hit Counters 246 of the Dictionary 211. It will be appreciated that the decompressor 210 maintains the same strings in the Exclusion Tables 225 as are maintained in the Exclusion Tables 25 by the compressor 10.

After updating the Exclusion Tables 225, control returns to the initialization point described above where appropriate resetting and clearing is performed.

The control flow charts of FIGS. 6–9 illustrate the detailed operations to be executed by the decompressor 210. The control 235 is considered as containing appropriate circuitry such as state machines, or appropriate software, to control execution of the operations.

Figure 6A:
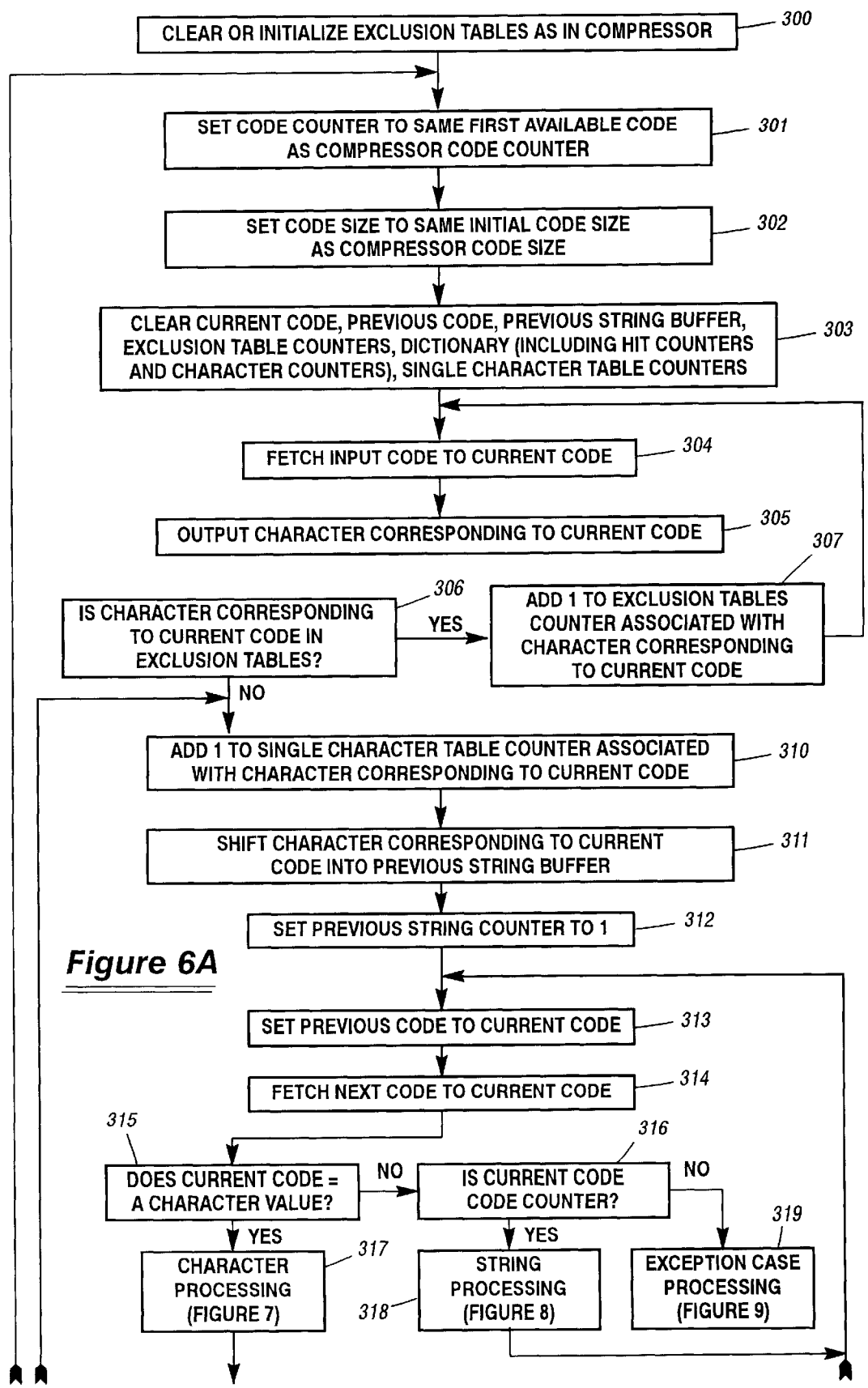
FIG. 6, comprised of FIGS. 6A and 6B, is a control flow chart illustrating the operations executed by the decompressor of FIG. 5 so as to perform data decompression in accordance with the present invention.
Figures 6, 6B:
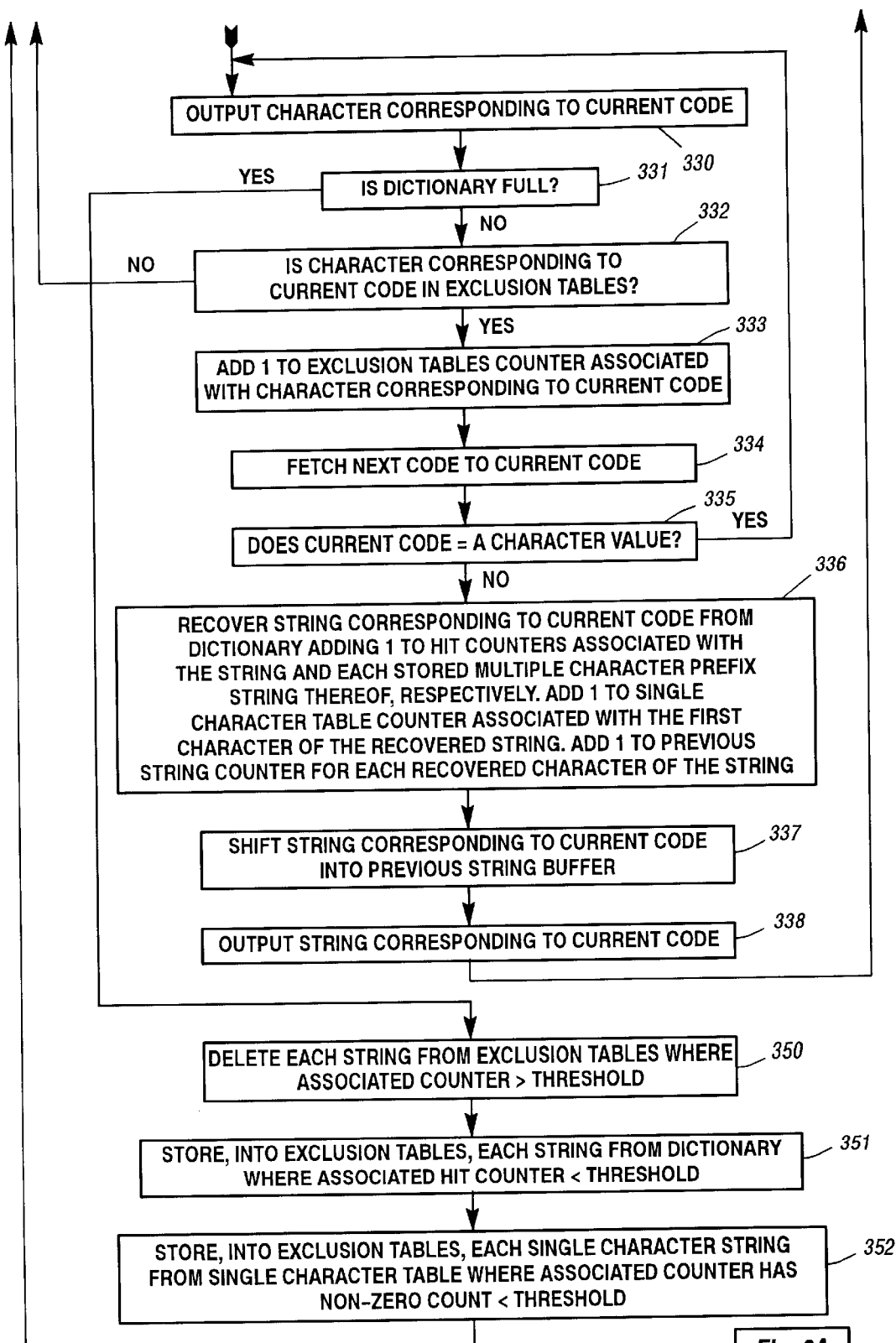

Referring to FIG. 6, with continued reference to FIGS. 2, 3 and 5, at a block 300, the Exclusion Tables 225 are either cleared or initialized in a manner consistent with that described above with respect to the block 90 of FIG. 4. The block 300 is implemented so that the decompressor 210 and the compressor 10 begin operation with the same contents in the corresponding Exclusion Tables and associated Counter Arrays. At a block 301, the Code Counter 222 is initialized in the manner described above with respect to the block 91 of FIG. 4. At a block 302, the Code Size register 223 is initialized to the beginning Code Size as explained above with respect to the block 92 of FIG. 4. At a block 303, the Current Code register 220, the Previous Code register 221, the Previous String Buffer 255, the Exclusion Table Counters 274–277, the Single Character Table Counters 261 and the Dictionary 211, including the Hit Counters 246 and Character Counters 247, are cleared.

At a block 304, an input compressed code is fetched to the Current Code register 220 utilizing the number of bits determined by Code Size. If control enters block 304 from block 303, the code that is fetched will be the first input code. Because of the above described operations of the compressor 10, the first fetched code is a single character. Accordingly, at a block 305, the character corresponding to the fetched Current Code is provided at the decompressor output 214.

At a block 306, the Exclusion Tables 225 are consulted to determine if the single character string corresponding to Current Code is included therein. Since the string is a single character, the Table 270 of single characters is accessed. If Current Code corresponds to an excluded character, the YES branch from the block 306 is taken to a block 307. At the block 307, the Exclusion Table Counter in the Counter Array 274 associated with the character corresponding to Current Code is incremented by 1. Control returns from the block 307 to the block 304 to fetch the next input compressed code to the Current Code register 220. The loop comprising the blocks 304–307 is executed until an input code is fetched that represents a single character string not included in the Exclusion Tables 225. When this occurs the NO branch from the block 306 is taken to a block 310.

It is appreciated that the blocks 304–307 provide initial previous string information to the decompressor 210 by fetching the initial input codes until the code representing the first non-excluded string is received. Because of the above described operations of the compressor 10, each such initial input code including this first non-excluded string is a single character. The decompressor 210 utilizes this fetched Current Code to provide the previous string on which to base an extended string for potential storage in a following decompression cycle in a manner to be described.

At a block 310, the Single Character Table Counter 261 associated with the character corresponding to Current Code is incremented by 1. At a block 311, the character corresponding to the fetched Current Code is shifted into the Previous String Buffer 255 which is utilized to hold the character or characters of the previous string. Correspondingly, at a block 312, the Previous String Counter 257 is set to 1. At a block 313, the Current Code in the Current Code register 220 is set into the Previous Code register 221 and at a block 314, the next input compressed code is fetched to the Current Code register 220.

Blocks 315 and 316 are included to determine the type of processing to be performed in accordance with the fetched Current Code. Accordingly, control proceeds from block 314 to block 315 wherein it is determined if the Current Code is equal to a character value. The function of the block 315 may be performed by determining if the value of Current Code is less than a predetermined value, where the predetermined value is greater than any character value. For example, in known compressor and decompressor arrangements, the character values are in the range from 0 up to a particular value. Several code values greater than the character values are often reserved for control functions. The code values greater than the control codes are then utilized to represent multiple character strings. The first such available code is the value initially set into the Code Counters. For example, in an ASCII environment, values 0–255 represent the characters, codes 256 and 257 may be utilized as control codes and codes 258–4095 represent multiple character strings. Thus, in the ASCII environment, the test of the block 162 would determine if Current Code was less than 256.

It is appreciated herein that control codes are not considered as included in the compressed code stream since the functions thereof are not germane to the invention. Therefore, the processing described herein is considered as ignoring the presence of control codes.

If, at the block 315, Current Code does not equal a character value, the NO branch from the block 315 is taken to the block 316. If the Current Code is equal to a character value, the YES branch from the block 315 is taken to a block 317 whereat character processing is performed. Details of the character processing of the block 317 are described with respect to FIG. 7.

At the block 316, the Current Code in the Current Code register 220 is compared to the code in the Code Counter 222 to determine if Current Code is less than Code Counter. If, at the block 316, Current Code is less than Code Counter, the code in the Current Code register 220 represents a multiple character string stored in the Dictionary 211. Accordingly, the YES branch from the block 316 is taken to a block 318 to perform string processing. Details of the string processing of the block 318 are described with respect to FIG. 8.

If, at the block 316, the code in the Current Code register 220 is equal to the code in the Code Counter 222, the Current Code represents a string not yet stored in the Dictionary 211. Accordingly, the NO branch from the block 316 is taken to a block 319 whereat exception case processing is performed. Details of the exception case processing of the block 319 are described with respect to FIG. 9.

When the string processing of the block 318 or the exception case processing of the block 319 is concluded, control returns to the block 313 for the next decompression cycle.

If, at the block 317, Current Code is equal to a character value and the character processing of the block 317 is performed, processing continues with a block 330. At the block 330, the character corresponding to Current Code is output by providing the character from the Current Code register 220 to the decompressor output 214.

Processing proceeds to a block 331 whereat a test is performed to determine if the Dictionary 211 is full. This test is conveniently performed by checking the overflow output of the Code Counter 222 to determine if the Code Counter 222 has overflowed as the result of the incrementation thereof during the processing of the flow charts of FIGS. 7–9 to be described.

If, at the block 331, the Dictionary 211 is not full, the NO branch from the block 331 is taken to a block 332. At the block 332, the Exclusion Tables 225 are consulted to determine if the character in the Current Code register 220 is included in the Exclusion Tables 225. As discussed above with respect to the block 306, conveniently, the Table 270 of single characters is searched to perform the function of the block 332. If the character corresponding to Current Code is not in the Exclusion Tables 225, the NO branch from the block 332 returns to the block 310.

If, at the block 332, the character corresponding to Current Code is included in the Exclusion Tables 225, the YES branch from the block 332 is taken to a block 333. At the block 333, the Exclusion Table Counter of the Counter Array 274 associated with the character corresponding to Current Code is incremented by 1. Since, at the block 332, the character corresponding to Current Code is in the Exclusion Tables 225, the decompressor 210 re-initializes the previous string information.

Accordingly, processing proceeds from the block 333 to a block 334 whereat the next input compressed code is fetched to the Current Code register 220. At a block 335, the Current Code is evaluated to determine if it is equal to a character value. Processing such as that described with respect to the block 315 is performed to execute the function of the block 335.

If the code in the Current Code register 220 represents a single character, the YES branch from the block 335 returns to the block 330 to continue the previous string re-initialization process. If, at the block 335, the code in the Current Code register 220 is not equal to a character value but instead represents a multiple character string, the NO branch from the block 119 is taken to continue the previous string re-initialization process at a block 336.

At this point in the processing, if the NO branch from the block 335 is taken, it is appreciated that the code in the Current Code register 220 represents a multiple character string stored in the Dictionary 211. Because of the processing experienced through the blocks 332–335, the Current Code cannot represent an exception case string that is not yet stored in the Dictionary.

Accordingly, at the block 336, the string corresponding to the code in the Current Code register 220 is recovered from the Dictionary 211 utilizing the Working Buffers 227 to hold the recovered characters of the string in the appropriate order. The Previous String Counter 257 is incremented for each recovered character of the string. As discussed herein, the methodologies utilized in recovering a string from a dictionary are well known for implementing the string recovery functionality of the block 336 (e.g., see said U.S. Pat. Nos. 4,558,302; 5,838,264 or 5,861,827).

Additionally, at the block 336, the Hit Counters 246 associated with the recovered string and with each stored multi-character prefix string thereof are incremented by 1. Furthermore, the Single Character Table Counter 261 associated with the first character of the recovered string is incremented by 1. An operational flow chart for performing the functionality of the block 336 is provided herein with respect to FIG. 10.

At a block 337, the characters of the string recovered at the block 336 are shifted from the Working Buffers 227 into the Previous String Buffer 255. Thus, a previous string is provided on which to base an extended string for potential storage in a following decompression cycle in a manner to be described. At a block 338, the characters of the recovered string are provided at the decompressor output 214. Control then returns to the block 313 to continue the processing.

It is appreciated from the above that the blocks 332–338 perform the decompressor previous string re-initialization process described above with control returning either from the block 332 to the block 310 or from the block 338 to the block 313 to continue the decompression processing. Previous string re-initialization is performed in the manner described so that the decompressor 210 continues to remain synchronized with the compressor 10.

At the block 331, when the Dictionary 211 is determined to be full, the YES branch from the block 331 is taken to blocks 350–352 whereat the Exclusion Tables 225 are updated, The blocks 350–352 perform functionality identical to the blocks 141–143, respectively, of FIG. 4 and the descriptions given above with respect thereto also apply to the blocks 350–352. However, reference numerals utilized to denote compressor elements are increased by 200 to represent corresponding decompressor elements.

After updating the Exclusion Tables 225 at the blocks 350–352, control returns to the block 301 to begin appropriate resetting and clearing prior to beginning a further cycle of selectively filling the Dictionary 211 with strings.

As discussed above, the Dictionary full test block 331 is located in the decompressor processing branch in which character processing 317 is performed. This is because in the compressor flow chart of FIG. 4, the mismatching character in the compressor Current Character register 21 is output at the block 140 when the compressor Dictionary 11 is determined to be full at the block 128.

Figure 7:
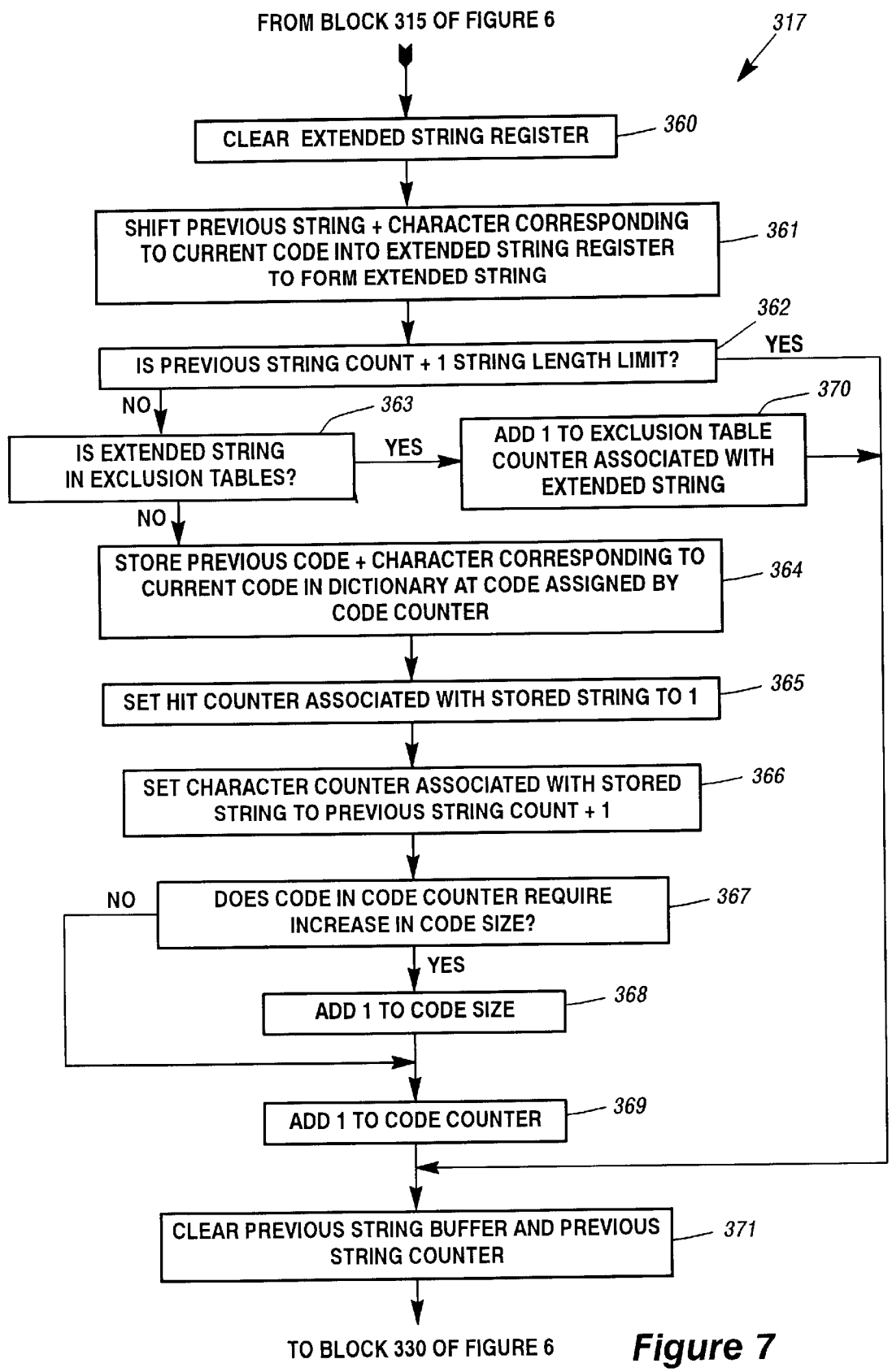
FIG. 7 is a control flow chart illustrating the character processing logic utilized in the flow chart of FIG. 6.

Referring to FIG. 7, with continued reference to FIGS. 2, 3, 5 and 6, details of the character processing block 317 of FIG. 6 are illustrated. Processing proceeds from block 315 of FIG. 6 to a block 360 whereat the Extended String register 226 is cleared.

Processing continues to a block 361 whereat the string corresponding to Previous Code extended by the character corresponding to Current Code is shifted into the Extended String register 226 to form an extended string. Conveniently, the string corresponding to Previous Code is held in the Previous String Buffer 255 and the character corresponding to Current Code is held in the Current Code register 220. The string concatenation function of the block 361 is readily performed by appropriately shifting the contents of the Previous String Buffer 255 and the Current Code register 220 into the Extended String register 226.

Control continues with blocks 362–370 whereat processing is executed similar to that described above with respect to the blocks 120–127 and 135, respectively, of FIG. 4. Briefly, at block 362, a test is performed to determine if the length of the extended string formed at the block 361 exceeds the string length limit stored in the String Length Limit register 234. Since, at the block 361, the extended string is formed by concatenating the previous string with a single character, the quantity (previous string count+1) provides the length of the extended string. The previous string count is derived from the Previous string Counter 257.

At the block 363, the appropriate one of the Tables 270–273 of the Exclusion Tables 225 (FIG. 3) is consulted in accordance with the length of the extended string. The Dictionary update functionality of the block 364 is well known, as explained above, where Previous Code is derived from the Previous Code register 221 and the character corresponding to current Code is derived from the Current Code register 220. At the blocks 365 and 366, the associated Hit Counter 246 is incremented and the associated Character Counter 247 is set to the length of the stored extended string.

If the length of the extended string does not exceed the string length limit (block 362) and the extended string is not in the Exclusion Tables 225 (block 363), the extended string is stored in the Dictionary 211 at the code assigned by the Code Counter 222 (block 364) and the Code Counter 222 is incremented (block 369).

If, however, at the block 362 or 363, the extended string exceeds the string length limit or the extended string is included in the Exclusion Tables 225, the associated YES branch is taken from the block 362 or from the block 363, through the block 370, to bypass the processing of the blocks 364–369. When this occurs, the extended string is not stored in the Dictionary 211 and the Code Counter 222 is not incremented.

When the extended string is included in the Exclusion Tables 225, the YES branch from the block 363 is taken to the block 370. At the block 370, the associated Exclusion Table Counter in the Counter Arrays 275–277 is incremented by 1.

The processing of the blocks 362–369 is performed so that the Dictionary 211 and the Code Counter 222 of the decompressor 210 remain synchronized with the Dictionary 11 and the Code Counter 22 of the compressor 10.

Whether the extended string is stored in or excluded from the Dictionary 211, processing continues at a block 371. At the block 371, the Previous String Buffer 255 and the Previous String Counter 257 are cleared. Processing continues with the block 330 of FIG. 6 discussed above.

Figure 8:
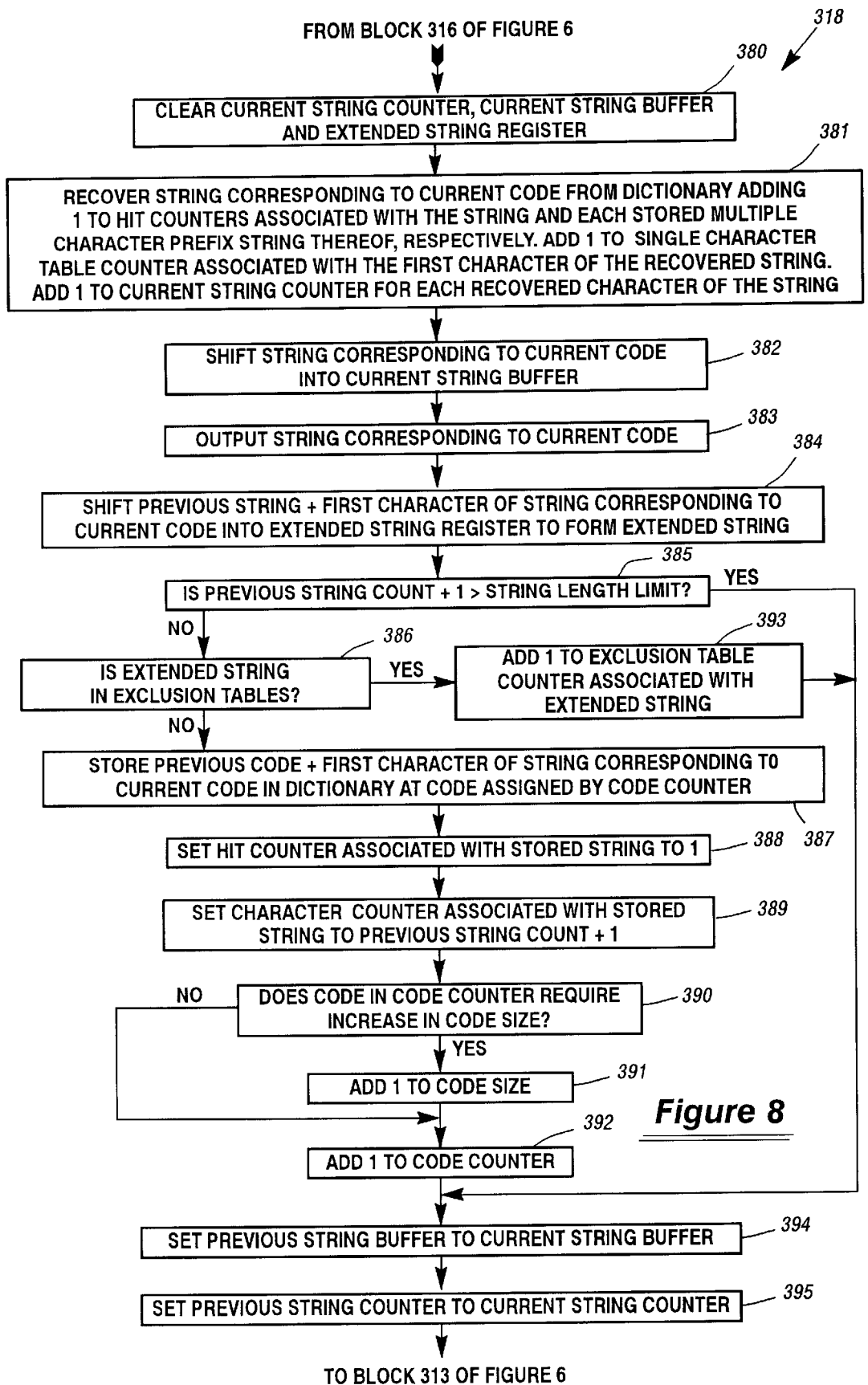
FIG. 8 is a control flow chart illustrating the string processing logic utilized in the flow chart of FIG. 6.

Referring to FIG. 8, with continued reference to FIGS. 2, 3 and 5–7, details of the string processing block 318 of FIG. 6 are illustrated. From the block 316 of FIG. 6, processing enters a block 380 whereat the Current String Counter 256, the Current String Buffer 254 and the Extended String register 226 are cleared.

Processing proceeds to a block 381 whereat the string corresponding to the code in the Current Code register 220 is recovered from the Dictionary 211 utilizing the Working Buffers 227 to hold the recovered characters of the string in the appropriate order. Additionally, associated Counters are incremented to accumulate appropriate statistics. The functionality of the block 381 is substantially the same as that of the block 336 of FIG. 6 and the descriptions given above with respect to the block 136 generally apply to the block 381. It is noted that in the block 336 the Previous String Counter 257 is incremented whereas in the block 381 the Current String Counter 256 is incremented. Details of the functionality of the block 381 are provided below with respect to FIG. 10.

At a block 382, the characters of the string recovered at the block 381 are shifted from the Working Buffers 227 into the Current String Buffer 254. At a block 383, the characters of the recovered string are provided at the decompressor output 214.

Blocks 384–393 perform functions similar to the respective blocks 361–370 discussed above with respect to FIG. 7 and the descriptions given above with respect to blocks 361–370 generally apply to the blocks 384–393. It is appreciated, however, that at the block 384, the extended string is formed by concatenating the string corresponding to Previous Code with the first character of the string corresponding to Current Code. The extension character is conveniently obtained from the Current String Buffer 254. Furthermore, at the block 387, the extended string stored in the Dictionary 211 comprises Previous Code and the first character of the string corresponding to Current Code.

Processing then enters a block 394 whereat the string held in the Current String Buffer 254 is set into the Previous String Buffer 255. At a block 395, the count in the Current String Counter 256 is set into the Previous String Counter 257. The processing of blocks 394 and 395 are performed to provide previous string information to the decompressor 210 for use in the next decompression cycle. Processing then returns to block 313 of FIG. 6.

Figure 9:
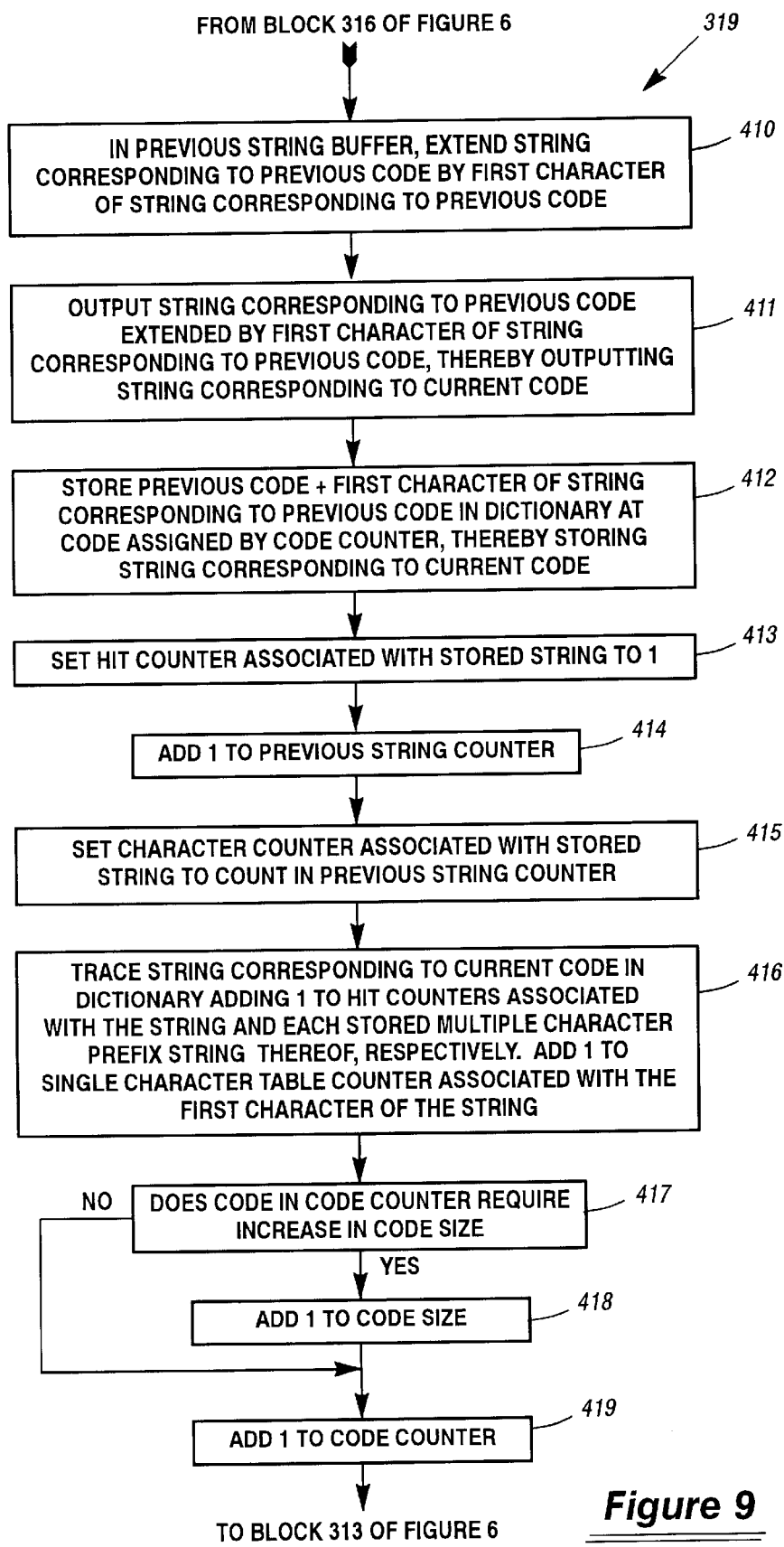
FIG. 9 is a control flow chart illustrating the exception case processing logic utilized in the flow chart of FIG. 6.

Referring to FIG. 9, with continued reference to FIGS. 2, 3 and 5–8, details of the exception case processing of the block 319 of FIG. 6 are illustrated. The exception case processing of block 319 is performed when Current Code is equal to Code Counter. This occurs when Current Code represents a string that has just been stored in the Dictionary 11 and matched by the compressor 10 but is not yet stored in the Dictionary 211 of the decompressor 210. Although exception case processing is well known in the art of LZW data compression and decompression (e.g., see said U.S. Pat. No. 4,558,302), the present implementation conveniently provides previous string information for use in the next decompression cycle in the preferred embodiments in a manner to be described.

Accordingly, processing proceeds from the block 316 of FIG. 6 to a block 410. At the block 410, the string corresponding to Previous Code is extended by the first character of the string corresponding to Previous Code. This function is conveniently performed in the Previous String Buffer 255 which holds the characters of the string corresponding to Previous Code. It is appreciated that the string as extended and held in the Previous String Buffer 255 is the string corresponding to the Current Code fetched into the Current Code register 220 at the block 314 of FIG. 6. Accordingly, at a block 411, the characters of the string now held in the Previous String Buffer 255 are provided from the Previous String Buffer 255 to the decompressor output 214.

At a block 412, the Dictionary 211 is updated by storing Previous Code from the Previous Code register 221 concatenated by the first character of the string corresponding to Previous Code. The extension character is conveniently provided in the Previous String Buffer 255. This string which, as explained above, corresponds to Current Code is stored in the Dictionary 211 at the code assigned by the Code Counter 222. As previously explained, the processing of FIG. 9 is performed when Current Code is equal to code Counter.

At a block 413, the Hit Counter 246 associated with the string stored at the block 412 is incremented by 1. At a block 414, the Previous String Counter 257 is incremented by 1 and, at a block 415, the Character Counter 247 associated with the string stored at the block 412 is set to the incremented count in the Previous String Counter 257. It is appreciated that this incremented count in the Previous String Counter 257 corresponds to the length of the string extended at the block 410 and stored in the Dictionary at the block 412.

Processing proceeds to a block 416 whereat the string corresponding to Current Code in the Dictionary 211 is traced, adding 1 to the Hit Counters 246 associated with the string and with each stored multi-character prefix string thereof, respectively. Additionally, the Single Character Table Counter 261 associated with the first character of the string is incremented by 1. The processing of the block 416 is performed so that the statistics maintained by the Hit Counters 246 and the Single Character Table Counters 261 remain synchronized with the statistics accumulated by the compressor 10. The functionality of the block 416 is similar to that of the block 381 of FIG. 8 except that the string characters are not recovered and the Current String Counter is not incremented. The detailed flow chart of FIG. 10 may be utilized in implementing the block 416 except that the blocks 432, 433, 437 and 438 would be bypassed.

It is appreciated that by the processing of the block 410, the Previous String Buffer 255 holds the string corresponding to Current Code, which string is one character longer than the string corresponding to Previous Code. Thus, by the processing of the block 410 and the processing of the block 414, whereat the Previous String Counter 257 was incremented by 1, the Previous String Buffer 255 and the Previous String Counter 257 conveniently provide the appropriate previous string information for the next decompression cycle.

Processing continues with blocks 417–419 whereat the Code Counter 222 is incremented in the manner described above with respect to the blocks 125–127 of FIG. 4. Processing then returns to the block 313 of FIG. 6.

It is appreciated from the descriptions given above that when control enters the exception case processing block 319, neither the strings corresponding to Previous Code and to Current Code nor the first character of the string corresponding to Previous Code are in the Exclusion Tables 225. Thus, LZW exception case processing may be performed as described with respect to FIG. 9 without string exclusion.

It is appreciated that the blocks 301, 302, 304, 305, 313–316, 364, 367–369, 383, 387, 390–392, 411, 412 and 417–419 depict the underlying LZW data decompression processing of FIGS. 6–9. Thus, any known implementation of LZW data decompression can be utilized in implementing these LZW data compression aspects.

Figure 10:
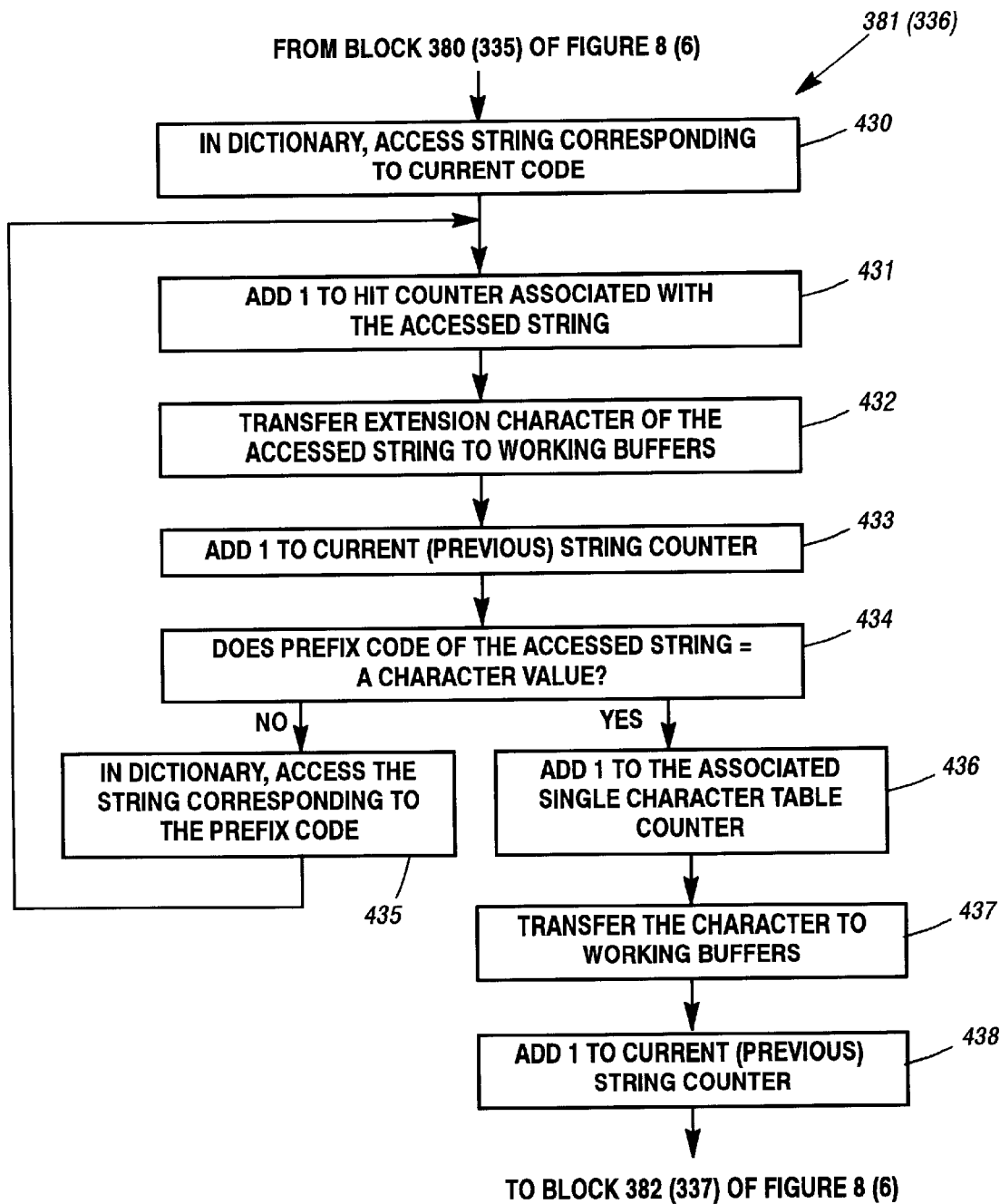
FIG. 10 is a control flow chart illustrating details of the string recovery blocks of FIGS. 6 and 8 and the string tracing block of FIG. 9.

Referring to FIG. 10, with continued reference to FIGS. 6, 8 and 9, details of the operations performed at the block 336 of FIG. 6, the block 381 of FIG. 8 and the block 416 of FIG. 9 are illustrated. FIG. 10 without the parenthesis applies to the block 381 of FIG. 8 and with the parenthesis to the block 336 of FIG. 6. It is appreciated from the foregoing that at the block 381 of FIG. 8 the current String Counter 256 is incremented and at the block 336 of FIG. 6 the Previous String Counter 257 is incremented.

Accordingly, at a block 430, the string corresponding to Current Code is accessed in the Dictionary 211. At a block 431, the Hit Counter 246 associated with the accessed string is incremented by 1. At a block 432, the Data Character in the field 244 of the accessed string is transferred to the Working Buffers 227. At a block 433, the Current String Counter 256 (Previous String Counter 257) is incremented by 1. At a block 434, the Prefix Code in the field 243 of the accessed string is tested to determine if it is equal to a character value. If not, the NO branch from the block 434 is taken to a block 435 whereat the string corresponding to the Prefix Code is accessed in the Dictionary 211. Control then returns to the block 431.

The loop comprising the blocks 431–435 is executed until, at the block 434, the Prefix Code of the accessed string is equal to a character value. When this occurs, the YES branch from the block 434 is taken to a block 436 whereat the Single Character Table Counter 261 associated with the character value is incremented by 1 and at a block 437, the character in the Prefix Code field 243 of the accessed string is transferred to Working Buffers 227. At a block 438, the Current String Counter 256 (Previous String Counter 257) is incremented by 1.

As discussed above, the flow chart of FIG. 10 may also be utilized in implementing the block 416 of FIG. 9 but bypassing the blocks 432, 433, 417 and 438.

The logic of FIG. 10 may also be utilized in extracting strings from the Dictionary for storage in the Exclusion Tables at the block 142 of FIG. 4 and the block 351 of FIG. 6. In this regard, the blocks 431, 433, 436 and 438 would not be utilized. In this manner, the characters of a string are placed into the Working Buffers for transfer to the appropriate one of the Exclusion Tables.

It is appreciated in FIGS. 6–9, that by the operation of the blocks 307, 310, 333, 336, 360, 365, 370, 381, 388, 389, 393, 413, 415 and 416, the decompressor Hit Counters 246, Character Counters 247, Single Character Table Counters 261 and Exclusion Table Counters 274–277 accumulate the same statistics as are maintained in the corresponding Counters of the compressor 10. It is furthermore appreciated in FIG. 6 that by the operation of the blocks 350–352, the decompressor Exclusion Tables 270–273 remain synchronized with the corresponding Exclusion Tables of the compressor 10. The decompressor 210 remains synchronized with the compressor 10 without the necessity of transferring Dictionaries, Exclusion Tables, Single Character Tables and escape codes therebetween.

An example of the operation of the compressor and decompressor embodiments described above is provided with respect to FIGS. 11–16. A small alphabet size and dictionary capacity are utilized in the example so that complete cycles of dictionary filling and Exclusion Tables updating can be illustrated. A 4 character alphabet having a 2 bit character size is utilized with the characters denoted as a, b, c and d. The numerical values of the 2 bit characters are 0, 1, 2 and 3. The Dictionary of the example has 16 locations requiring a 4 bit wide address. The Code Counters of the compressor and decompressor are, therefore, 4 bits wide capable of counting up to 15 prior to overflow. When the Code Counter is at a count of 15, the next increment of 1 results in a counter overflow.

Since the character values are 0–3, the Code Counters are initialized to a count of 5. The count of 4 is not utilized in the example and may be reserved as a control code. The multiple character string codes, therefore, are the codes 5 through 15. The String Length Limit is selected as 4. The Exclusion Tables Threshold, the Dictionary String Threshold and the Single Character Table Threshold are each selected as 2.

It is appreciated that although the example Dictionary only has a capacity of 16 strings, in a practical embodiment the Dictionary will be significantly larger holding, for example, 4096 strings.

Figure 12:
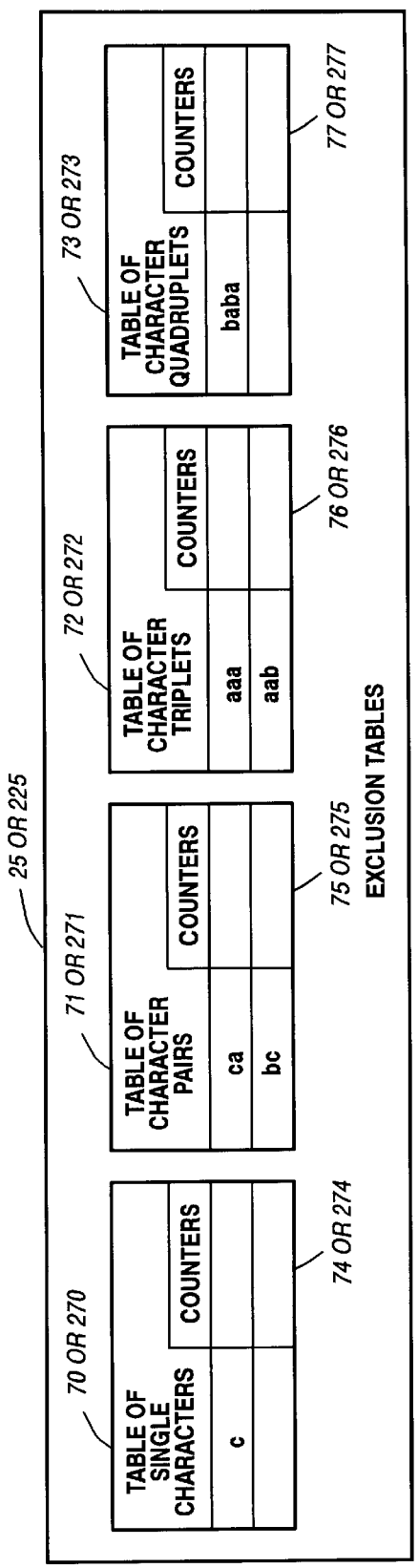
FIG. 12 illustrates the exclusion tables generated by the compressor of FIG. 1 pursuant to the operational example chart of FIG. 11.
Figure 14:
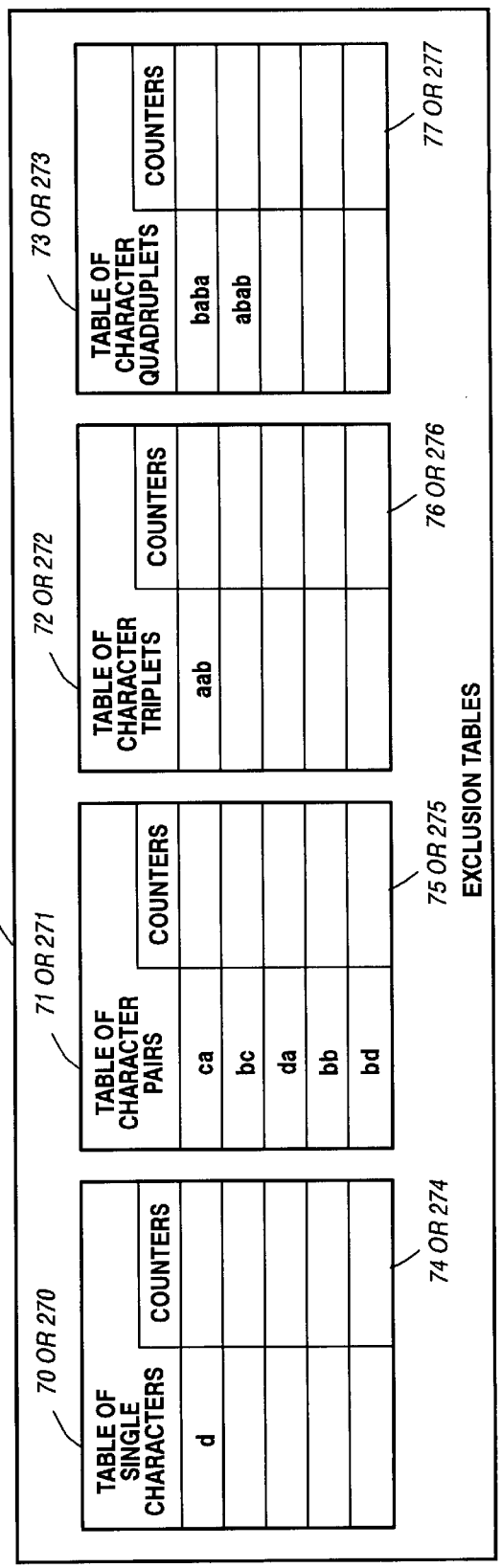
FIG. 14 illustrates the exclusion tables generated by the compressor of FIG. 1 pursuant to the operational example chart of FIG. 13.

FIG. 11 is a compressor operational example utilizing initially empty Exclusion Tables. At the end of the dictionary filling cycle of FIG. 11, the Exclusion Tables are populated with strings utilizing the statistics accumulated in FIG. 11 pursuant to the Exclusion Tables update criteria described with respect to FIG. 4, blocks 141–143. FIG. 12 illustrates the Exclusion Tables generated by the operations of FIG. 11. FIG. 13 is a further operational example of the compressor but utilizing the Exclusion Tables of FIG. 12. FIG. 14 illustrates the Exclusion Tables resulting from the operational example of FIG. 13 again utilizing the Exclusion Tables update criteria of FIG. 4, blocks 141–143.

FIG. 15 is an operational example of the decompressor in response to the compressed cede output of FIG. 11 and where the decompressor Exclusion Tables are initially empty. From the operations illustrated in FIG. 15, the decompressor accumulates the same statistics as the compressor that also results in the Exclusion Tables of FIG. 12. The decompressor Exclusion Tables update criteria are described with respect to FIG. 6, blocks 350–352. FIG. 16 is a further operational example of the decompressor in response to the compressed code output of FIG. 13 but utilizing the Exclusion Tables of FIG. 12. By the operations of FIG. 16, the decompressor also generates the Exclusion Tables of FIG. 14.

Since in FIGS. 11 and 15 the compressor and decompressor begin operations with empty Exclusion Tables, there are no Exclusion Table columns in these figures. Neither the compressor nor the decompressor can encounter any strings in the empty Exclusion Tables. Since in FIGS. 11–16 the Code Counter is initialized to a code of 5, the Code Size is initialized to 3 bits. At the appropriate blocks of the operational flow charts, when the Code Counter acquires a count of 7, an increase in Code Size from 3 to 4 bits is required.

Referring to FIG. 11, with continued reference to FIGS. 1–4, an example of the operation of the compressor 10 in accordance with the flow chart of FIG. 4 is illustrated. At the top of FIG. 11, an input data character stream is shown where sequential characters are identified by character sequence numbers. This is done to facilitate following the progress of the characters through the steps of the example. It is appreciated that the sequence numbers are shown for purposes of character identification and do not appear in the actual data character stream.

The example is largely self-explanatory, with the actions performed delineated in the left-hand column and the blocks of FIG. 4 that participate in the actions designated in the right-hand column. The Extended String Register column depicts the string under consideration at an action and the Extended String Counter column indicates the number of characters in the string. When, at an action, the block 114 of FIG. 4 indicates incrementing the Hit Counter associated with a matched string, parenthesis are utilized in the Dictionary columns to denote the matched string. In the actions of FIG. 11, since the Exclusion Tables 25 are empty, no string is excluded from the Dictionary 11 because of inclusion in the Exclusion Tables.

In action 1, the compressor Code Counter is set to the first available code of 5 at the block 91 (FIG. 4) and, at the block 98, the Single Character Table Counter associated with the character "a" is incremented by 1.

The underlying data compression processing through the actions of FIG. 11 basically utilizes the LZW methodology but with string statistics accumulated in the Dictionary and in the Single Character Table as illustrated. For example, in action 2, the string "aa" is stored at the string code 5 with the associated Hit Counter set to 1 at the block 123 and the associated Character Counter got to 2 at the block 124. In actions 3–5, the strings "a" and "aa" are matched and the extended string "aaa" is stored. In action 3, the Single Character Table Counter associated with the matched character "a" is incremented by 1 at the block 98. In action 4, the string "aaa" is matched in the Dictionary and the associated Hit Counter is incremented by 1. In action 5, the code 5 of the string "aa" is outputted. The string "aaa" is stored in the Dictionary with the string code of 6 by storing the prefix code 5 in the Prefix Code field and the extension character "a" in the Character field. At the block 123 (FIG. 4), the Hit Counter associated with the stored string is set to 1 and, at the block 124, the associated Character Counter is set to the count in the Extended String Counter.

In action 33, the string "abcab" is excluded because the string length of 5 exceeds the String Length Limit which, for the example, is set at 4. Thus, at the block 120 of FIG. 4, the YES branch is taken to bypass Dictionary storage and Code Counter incrementation. The code 14 of the longest match "abca" is, however, outputted.

In action 35, the string "bc" is stored at the last empty location in the Dictionary (block 122) and in action 36, the Code Counter is incremented to overflow (block 127). In action 36, the Current Character "c" is outputted (block 140).

More detailed descriptions of the actions of FIG. 11 relative to the blocks of FIG. 4 are readily apparent and will not be provided for brevity.

Referring to FIG. 12, with continued reference to FIGS. 4 and 11, the Exclusion Tables 25 of FIG. 12 are populated with the illustrated strings from the accumulated statistics of FIG. 11 at the blocks 141–143 of FIG. 4. Since the Exclusion Tables 25 did not participate in the processing of FIG. 11, the block 141 is bypassed as explained above. With respect to the block 142 of FIG. 4, it is observed in action 35 of FIG. 11 that the string "bc" was only encountered once as evidenced by the count of 1 in the associated Hit Counter. The associated Character Counter has a count of 2. Since the count in the Hit counter is less than the Dictionary String Threshold, which for the example is set at 2, the string "bc" is stored into the Exclusion Table 71 of character pairs to be excluded in the next dictionary filling cycle. Similarly, action 24 of FIG. 11 indicates the same accumulated statistics for the string "ca" and this string is also stored in the Table 71. In a similar manner, the strings stored in the Tables 72 and 73 of FIG. 12 are obtained by examining the Dictionary statistics at actions 5, 8 and 19 of FIG. 11.

With respect to the block 143 of FIG. 4, the Table 70 of FIG. 12 is populated with the single character string "c" from the pertinent statistics in action 23 of FIG. 11.

Referring to FIG. 13, with continued reference to FIGS. 1, 4, 11 and 12, a further example of the operation of the compressor 10 in accordance with the flow chart of FIG. 4 is illustrated. FIG. 13 is an operational continuation of FIG. 11 utilizing the Exclusion Tables of FIG. 12. The format of FIG. 13 is substantially the same as that of FIG. 11 and descriptions given above with respect to FIG. 11 are applicable. Since the operations of FIG. 13 accumulate Exclusion Table statistics, an Exclusion Tables column and a column for the associated Exclusion Table Counters are included.

The processing illustrated in FIG. 13 is substantially the same as that described above with respect to FIG. 11 with statistics being accumulated in the Dictionary Hit Counters and Character Counters as well as in the Single Character Table Counters. In addition, statistics are accumulated in the Exclusion Table Counters as depicted in actions 5, 8, 19, 23, 34–36, 41, 44, and 55. In these actions, the strings encountered in the Exclusion Tables of FIG. 12, at the blocks 95 and 121 of FIG. 4, are excluded from storage in the Dictionary and the Code Counter is not advanced. The codes from the Code Counter that would otherwise have been usurped by these strings are utilized for storing other strings which may tend to be more useful.

It is appreciated that the exclusion of strings from the Dictionary based on the Exclusion Tables is interwoven into the LZW processing so that even if a string is excluded, the string still benefits from whatever compression the string prefix has achieved. This is because the code of the prefix of the excluded string is output at the block 116 of FIG. 4 as the longest match for the compression cycle.

In the manner described above with respect to FIG. 11, in actions 64 and 65 the last string is stored in the Dictionary and the Code Counter is incremented resulting in the counter overflow detected at the block 128 of FIG. 4. In action 65, the character in the Current Character register is output at the block 140 of FIG. 4.

Referring to FIG. 14, with continued reference to FIGS. 1, 4, 12 and 13, the updated Exclusion Tables 25 resulting from the update processing of block 141–143 of FIG. 4 from the statistics accumulated in FIG. 13 are illustrated. The updating operations of the blocks 141–143 were described above with respect to FIGS. 4 and 11. After conclusion of the dictionary filling cycle of FIG. 13, the blocks 141–143 modify the status of the Exclusion Tables 25 illustrated in FIG. 12 to provide the Exclusion Tables 25 illustrated in FIG. 14.

At the block 141 of FIG. 4, strings are deleted from the Exclusion Tables where the associated Exclusion a Tables Counters are greater than the Exclusion Tables Threshold which for the example, is set at 2. Thus, from actions 36 and 44 of FIG. 13, the strings "c" and "aaa" are deleted from the Exclusion Tables illustrated in FIG. 12.

At the block 142 of FIG. 4, strings are stored into the Exclusion Tables from the Dictionary where the associated Hit Counters are less than the Dictionary String Threshold which, for the example, is set at 2. Thus, from actions 38, 62, 64 and 51 of FIG. 13, the strings "da", "bb", "bd" and "abab" have been added to the Exclusion Tables of FIG. 14.

At the block 143 of FIG. 4, single character strings from the Single Character Table are stored into the Exclusion Tables where the associated Single Character Table Counters have non-zero counts less than the Single Character Table Threshold. For the example, the Single Character Table Threshold is set at 2. Thus, from action 37 of FIG. 13, the string "d" has been added to the Exclusion Tables of FIG. 14.

Referring to FIG. 15, with continued reference to FIGS. 2, 3, 5 and 6–9, an example of the operation of the decompressor 210 in accordance with the flow charts of FIGS. 6–9 is illustrated. The format of FIG. 15 is generally similar to that of FIG. 11 and descriptions given above with respect to FIG. 11 are applicable to FIG. 15. The input compressed code stream at the top of FIG. 15 is the compressor output illustrated in FIG. 11. It is observed that the output of FIG. 15 is the recovered data character stream illustrated at the top of FIG. 11. It is further observed, from the respective Dictionary columns of FIGS. 11 and 15, that the decompressor 210 constructs the contents of the Dictionary 211 to store the same strings at the same codes as the Dictionary 11 of the compressor 10. It is also appreciated that, in FIG. 15, the Dictionary Hit Counters and Character Counters as well as the Single Character Table Counters accumulate the same statistics for the same strings as in FIG. 11. The Extended String register column of FIG. 15 depicts the string under consideration in an action for storage in the decompressor Dictionary. The operational example of FIG. 15 utilizes the empty Exclusion Tables (block 300). When, in an action, the blocks 336, 381 and 416 of FIGS. 6–9 indicate incrementing the Hit Counters associated with a recovered or traced string and the multi-character prefix strings thereof, parenthesis are utilized in the Dictionary columns to denote such strings.

The underlying data compression processing through the actions of FIG. 15 basically utilizes the LZW methodology but with string statistics accumulated in the Dictionary and in the Single Character Table as illustrated. For example, in actions 21 and 22, with respect to the block 381 of FIG. 8, statistics are accumulated for the recovered string "abc". In actions 25–28, with respect to block 416 of FIG. 9, statistics are accumulated for the traced string "abca".

In action 29, the string "abcab" is excluded because the string length of 5 exceeds the String Length Limit which, for the example, is set at 4. Thus, at the block 362 of FIG. 7, the YES branch is taken to bypass Dictionary storage and Code Counter incrementation. The string is, however, properly recovered at the output indicated in actions 25 and 29.

In action 30, the string "bc" is stored at the last empty location in the Dictionary (block 364) and in action 31, the Code Counter is incremented to overflow (block 369). In action 31, the character corresponding to Current Code is outputted (block 330).

In action 31 when, at the block 331 of FIG. 6, the Dictionary 211 is determined to be full, the decompressor 210 executes the blocks 350–352 to populate the Exclusion Tables 225 as illustrated in FIG. 12. The Exclusion Tables update is identical to that described above with respect to the blocks 141–143 of FIG. 4, the operational example of FIG. 11 and the descriptions given with respect to FIG. 12. The appropriate accumulated statistics are illustrated in actions 5, 6, 17, 20, 23 and 30 of FIG. 15.

Referring to FIG. 16, with continued reference to FIGS. 2, 3, 5, 6–9, 12 and 15, a further example of the operation of the decompressor 210 in accordance with the flow charts of FIGS. 6–9 is illustrated. FIG. 16 is an operational continuation of FIG. 15 utilizing the Exclusion Tables 225 of FIG. 12. The format of FIG. 16 is substantially the same as that of FIG. 15 and descriptions given above with respect to FIG. 15 are applicable. Since the operations of FIG. 16 accumulate Exclusion Table statistics, an Exclusion Tables column and a column for the associated Exclusion Table Counters are included.

The input compressed code stream at the top of FIG. 16 is the compressor output illustrated in FIG. 13. It is observed that the output of FIG. 16 is the recovered data character stream as illustrated at the top of FIG. 13. It is further observed, from the respective Dictionary columns of FIGS. 13 and 16, that the decompressor 210 constructs the contents of the Dictionary 211 to store the same strings at the same codes as the Dictionary 11 of the compressor 10. Furthermore, by the operations of FIG. 16, the Dictionary Hit Counters and Character Counters, the Single Character Table Counters and the Exclusion Table Counters accumulate the same statistics as the counterpart Counters with respect to FIG. 13.

Furthermore, the processing illustrated in FIG. 16 is substantially the same as that described above with respect to FIG. 15 with the statistics being accumulated in the Dictionary Hit Counters and Character Counters as well as in the Single Character Table Counters. In addition, in FIG. 16, statistics are accumulated in the Exclusion Table Counters as depicted in actions 5, 6, 16, 18, 25–27, 32, 34 and 45. In these actions, the strings encountered in the Exclusion Tables of FIG. 12, at the appropriate blocks of FIGS. 6–9, are excluded from storage in the Dictionary and the Code Counter is not advanced.

In actions 49 and 50, in the manner described above with respect to FIG. 15, the last string is stored in the Dictionary and the Code Counter is incremented resulting in the counter overflow detected at the block 331 of FIG. 6. In action 50, the character corresponding to Current Code had been output at the block 330 of FIG. 6.

After conclusion of the dictionary filling cycle of FIG. 16, the blocks 350–352 modify the status of the Exclusion Tables 225 illustrated in FIG. 12 to provide the Exclusion Tables 225 illustrated in FIG. 14. The operations of the blocks 350–352 of FIG. 6 are identical to those described above for FIG. 14 with respect to the blocks 141–143 of FIG. 4.

With respect to the block 350 of FIG. 6, actions 27 and 34 of FIG. 16 provide the statistics for deleting the strings discussed above from the Exclusion Tables of FIG. 12. With respect to the block 351 of FIG. 6, the actions 29, 40, 47 and 49 of FIG. 16 provide the statistics for adding the strings discussed above from the Dictionary to the Exclusion Tables. With respect to the block 352 of FIG. 6, the action 27 of FIG. 16 provides the statistics for adding the string discussed above from the Single Character Table to the Exclusion Tables.

Figure 17:
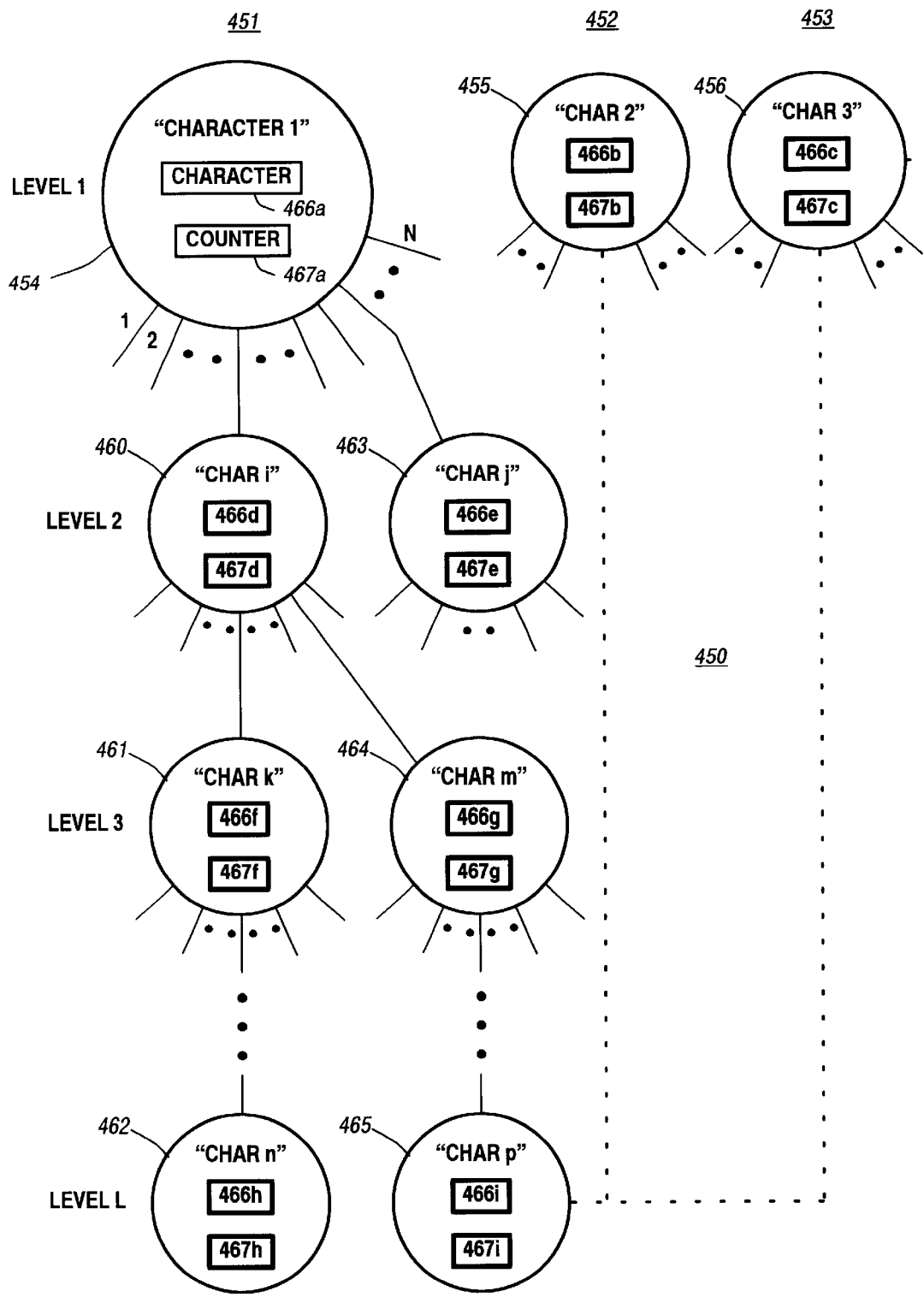
FIG. 17 is a data structure diagram illustrating a tree structure utilized in determining the strings with which to populate the exclusion tables of FIG. 3 in an alternative mode of operation.

Referring to FIG. 17, an automatic procedure for populating the Exclusion Tables 25 and 225 with an initial set of strings is provided. A tree data structure 450 is illustrated that is utilized in selecting the strings for populating the Exclusion Tables. The data structure 450 is comprised of a plurality of linked list trees 451–453 beginning with respective root nodes 454–456. The root nodes represent the respective characters of the alphabet over which compression is being performed. For the trees 452 and 453, only the root nodes 455 and 456 are illustrated for simplicity. Each tree, such as the tree 451, is further comprised of linked descendent nodes 460–465. Each node represents a character of a string and a string is stored in a tree by a path from the root node through the linked nodes representing the string characters. For example, the string "char 1, char i, char k" is represented by the nodes 454, 460 and 461. It is appreciated by way of further example, that the sub-string "char 1, char i" is stored by the nodes 454 and 460 while the string "char 1, char J" is stored by the nodes 454 and 463.

The trees 451–453 are arranged in levels denoted as Level 1, Level 2, Level 3, . . . , Level L. The root nodes of the trees are in Level 1. The children nodes of the roots are in Level 2. The grandchildren nodes are in Level 3 and the leaf nodes are in Level L. The depth of the trees are chosen such that a path from the root to a Level L node stores a string having a number of characters equal to the string length limit parameter stored in the String Length Limit register 34 (FIG.

1). It is thus appreciated, that the root nodes at Level 1 represent single character strings, the nodes at Level 2 represent character pairs, the nodes at Level 3 represent character triplets and the nodes at Level L represent strings of string length limit characters.

The nodes include respective character fields 466(a–i) for storing the respective characters represented by the nodes. The nodes further include respective counters 467(a–i) for maintaining respective counts of the number of times the respective nodes have been visited in a manner to be described.

The manner in which the tree data structure 450 is utilized to identify strings with which to populate the Exclusion Tables will now be described. A large sample of the data over which compression is to be performed is provided. The nodes of the data structure are created as the characters of the data sample are read therein.

The first character of the sample is read and an appropriate root node is created by setting the character field 466 thereof to the character value and the counter 467 thereof to 1. The L-1 characters following the first character are sequentially read into the tree by creating a linked chain of descendent nodes, from the created root node, for Level 2 through Level L and setting the character fields 466 thereof to the respective character values. The counters 467 of these created nodes are set to 1.

The same procedure is repeated but now utilizing the second character of the sample and the L-1 characters following the second character, creating the appropriate root node and the appropriate nodes descendent therefrom. It is appreciated that as the process continues, appropriate root and descendent nodes may already have been created for some or all of the characters of a string being read into the data structures If a node for the character already exists when the character is read, the counter 467 of the node is increased by 1. This process is continued for each character of the sample until all of the character strings of the sample have been read into the data structure 450.

By the above described process, all of the strings in the sample including single character strings, character pairs, character triplets up to strings having string length limit characters are stored in the trees 451–453 of the data structure 450 with the number of occurrences of each string provided by the associated counter 467. Since strings are read into the trees of the data structure 450 from the root down to the leaves, the count in a counter 467 of a node will be greater than or equal to the count in the counters 467 of all of the descendent nodes thereof.

With continued reference to FIGS. 2 and 17, the data structure 450, with all of the strings of the sample read therein, is utilized to populate the Exclusion Tables 25 in the following manner. The single character strings for populating Table 70 are derived from the Level 1 root nodes of the data structure 450. The character pair strings for populating the Table 71 are derived from the Level 2 nodes which, as discussed above, represent the character pair strings. Similarly, the character triplet strings for populating the Table 72 are derived from the Level 3 nodes and the Tables following the Table 72 are populated from the corresponding levels of the tree structure 450. The last Table 73 is populated from the strings derived from Level L.

A string is utilized to populate a Table if the count in the associated counter 467 is less than a predetermined threshold. The threshold can be the same for the entire data structure 450 or different thresholds can be utilized at different levels. The threshold or thresholds are established based on the actual distribution of the number of occurrences reflected in all of the counters 467. The higher the threshold, the larger will be the number of strings that will be stored in the Exclusion Tables 25 and thus excluded from storage in the Dictionaries.

A string for populating a Table being processed is derived from the selected node of the associated Level by tracing upward through the tree from the selected node through the linking nodes back to the root. For example, if node 465 is selected from Level L to provide the string associated therewith for populating the Table 73, the tree 451 is accessed from the node 465 back through the nodes 464, 460 and 454 to provide the string "char 1, char i, char m, . . . , char p" for populating the Table 73.

The retrieval of strings from the data structure 450 is facilitated by the fact that every node has at most one incoming branch from a higher node. Thus, the backward trace from a node to a root traverses a unique set of nodes, thereby providing a unique string for populating a Table in the Exclusion Tables.

Figure 18:
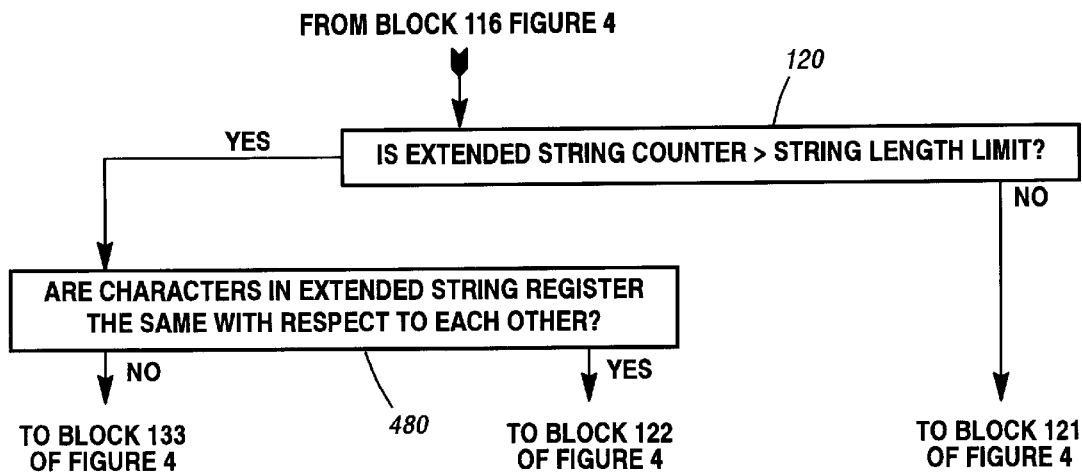
FIGS. 18 and 19 are embodiment modifications to FIGS. 4, 7 and 8 for accommodating input data character runs.

Referring to FIG. 18, with continued reference to FIGS. 1 and 4, where the same reference numerals indicate the same elements with respect to FIG. 4, a modification to FIG. 4 for accommodating input data character runs is illustrated. As discussed above, strings greater than the string length limit are excluded from compressor Dictionary 11 in order to preserve Dictionary codes for shorter and potentially more useful strings. If, however, a run of the same character is occurring, it may be advantageous to remove the string length limitation from the storage of segments of the run in the Dictionary. In this way, the compression capability of LZW with respect to run data will not be impeded.

Accordingly, a block 480 is interposed in the YES branch of the block 120 of FIG. 4. At the block 480, the string in the Extended String register 26 is examined to determine if the characters thereof are the same with respect to each other. If the characters are the same, it is likely that a data character run is in progress. When this occurs., the YES branch from the block 480 is returned to the block 122 of FIG. 4 for storage of the extended string in the Dictionary 11. When the YES branch of the block 480 is taken, the block 121 of FIG. 41 whereat the Exclusion Tables are consulted, is bypassed. As explained above, the Exclusion Tables in the preferred embodiment do not include strings that are greater than the string length limit.

When, at the block 480, the characters of the string in the Extended String register 26 are not the same with respect to each other, the NO branch from the block 480 is returned to the block 133 of FIG. 4. When the NO branch from the block 480 is taken, the processing is the same as that described above with respect to FIG. 4.

Figure 19:
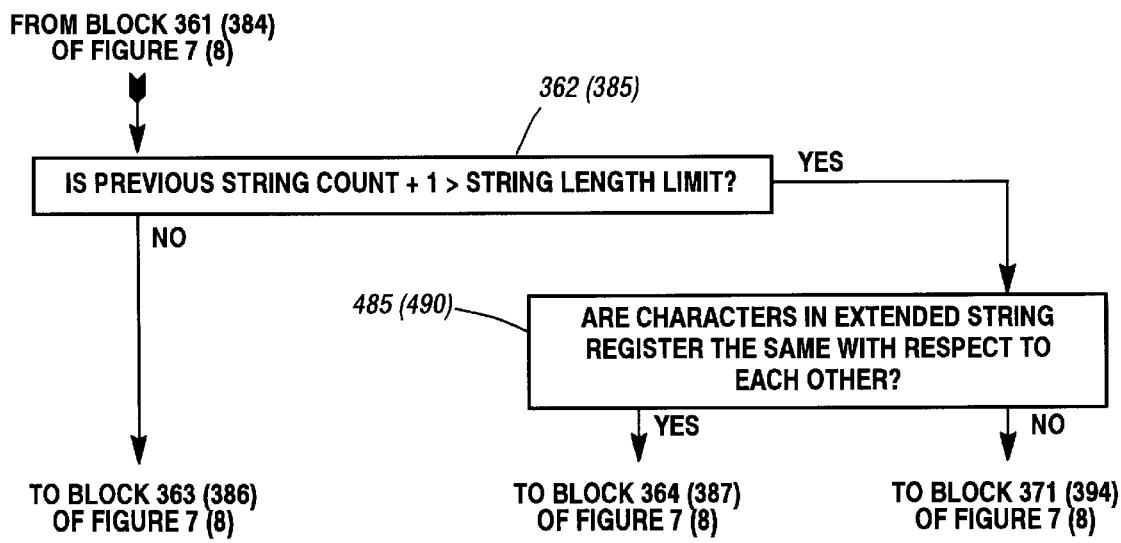

Referring to FIG. 19, with continued reference to FIGS. 5, 7 and 8, where the same reference numerals indicate the same elements with respect to FIGS. 7 and 8, the decompressor modification counter part of that of FIG. 18 is illustrated. When the modification of FIG. 18 is utilized in the compressor flow chart of FIG. 4, the modification of FIG. 19 is utilized in the decompressor flow charts of FIGS. 7 and 8 so that the decompressor remains synchronized with the compressor. FIG. 19 depicts the modification to both FIGS. 7 and 8 where the numbers in parenthesis refer to the modification to FIG. 8.

In a manner similar to that described above with respect to FIG. 18, a block 485 (490) is interposed in the YES branch of the block 362 (385). At the block 485 (490), the extended string in the Extended String register 226 is examined to determine if the characters thereof are the same with respect to each other. The process flow and operations are similar to those described above with respect to FIG. 18 and will not be specifically repeated for brevity.

When the modification of FIGS. 18 and 19 is utilized, strings greater than the string length limit can be stored in the Dictionaries. Accordingly, modifications may be required in the Exclusion Tables and in the logic of block 142 of FIG. 4 and 351 of FIG. 6 to accommodate or exclude these strings.

As an alternative to, or extension of, the modifications of FIGS. 18 and 19, the techniques disclosed in U.S. Pat. No. 6,172,624, issued Jan. 9, 2001, may be utilized in the present invention to process runs in the input data character stream.

Although a specific exclusion table structure was described above with respect to FIG. 3, it is appreciated that exclusion table arrangements other than those described may be utilized in practicing the invention. It is furthermore appreciated from the above descriptions that the decompressor 210 constructs the Dictionary 211 and the Exclusion Tables 225 to be identical to the Dictionary 11 and Exclusion Tables 25 of the compressor 10 utilizing only the compressed code stream received from the compressor. It is advantageous that no escape codes are required in practicing the present invention.

The above described embodiments of the invention utilize implicit recognition of single character strings and with the Single Character Tables used for accumulating statistics with respect to the single character strings. It is appreciated that the present invention may also be utilized with the architecture where the single character strings are explicitly stored and matched in the Dictionaries. In such an embodiment the Single Character Tables would not be utilized with the associated statistics being accumulated in appropriate Counters in the Dictionaries.

The above described embodiments of the invention utilize dynamically updated Exclusion Tables to exclude infrequently encountered strings from the Dictionaries. The embodiments may also be utilized, with simple modifications, to begin operations with frequently encountered strings on a dynamic basis. One such modification would involve not clearing strings from the Dictionaries where the associated Character Counters are greater than a predetermined threshold. A further embodiment may be effected at block 141 of FIG. 4 and block 350 of FIG. 6 by adding to the Dictionaries the frequently encountered strings that are deleted from the Exclusion Tables.

A further variant of the present invention for refining the contents of the Exclusion Tables would be to utilize numerous cycles of the above described embodiments with a large body of representative data prior to in-service use of the system. In this manner, the Exclusion Tables will be refined over numerous cycles to contain optimally excludable strings. This same process can be applied to the above described variant of the invention in dynamically refining pre-stored frequently encountered strings.

In the above embodiments, the input data characters can be over any size alphabet having any corresponding character bit size. For example, the data characters can be textual data, image pixel data or bitmap data. The input data can also be binary characters over the two character binary alphabet 1 and 0 having a one-bit size character.

It is appreciated that the above described embodiments of the invention may be implemented in hardware, firmware, software or a combination thereof. Discrete circuit embodiments may readily be implemented for performing the various described functions. In a software embodiment, appropriate modules programmed with coding readily generated from the above described flow charts may be utilized.

While the invention has been described in its preferred embodiments, it is to be understood that the words which have been used are words of description rather than of limitation and that changes may be made within the purview of the appended claims without departing from the true scope and spirit of the invention in its broader aspects.

What is claimed is:

1. A data compression method for compressing an input stream of data characters into an output stream of compressed codes, comprising:

storing, in storage means, strings of data characters encountered in said input stream, said stored strings having respective codes associated therewith, searching said input stream by comparing said input stream to said stored strings to determine the longest match therewith, outputting the code associated with said longest match so as to provide said output stream of compressed codes, providing an exclusion table structure for storing strings of data characters to be excluded from storage in said storage means, forming an extended string comprising said longest match extended by the next data character in said input stream following said longest match, comparing said extended string to the strings of data characters stored in said exclusion table structure to determine if said extended string is included therein, storing said extended string in said storage means and assigning a code corresponding to said stored extended string if said extended string is not included in said exclusion table structure, bypassing the steps of storing said extended string in said storage means and assigning a code corresponding to said stored extended string if said extended string is included in said exclusion table structure, and modifying the contents of said exclusion table structure by deleting strings therefrom that are frequently encountered therein and adding strings thereto that are infrequently encountered in said storage means.

2. The compression method of claim 1 wherein said modifying step includes counting the number of times a string is encountered in said exclusion table structure, thereby providing an exclusion table string count for said encountered string, and deleting said encountered string from said exclusion table structure if said exclusion table string count therefor exceeds a predetermined threshold.

3. The compression method of claim 1 wherein said modifying step includes counting the number of times a stored string is encountered in said storage means, thereby providing a storage means string count for said encountered string, and storing said encountered string in said exclusion table structure if said storage means string count therefor is less than a predetermined threshold.

4. The compression method of claim 3 wherein said modifying step further includes providing a storage means string count of 1 for said extended string when said extended string is stored in said storage means.

5. The compression method of claim 1 wherein said searching step comprises comparing said input stream to said stored strings until a mismatching input data character occurs, thereby determining said longest match, said method further including, determining if said mismatching character is included in said exclusion table structure as a single character string, using said mismatching character to begin a next string search for a longest match if said mismatching character is not included in said exclusion table structure as a single character string, if said mismatching character is included in said exclusion table structure as a single character string, outputting said mismatching character and fetching and outputting further input data characters until an input data character is fetched that is not included in said exclusion table structure as a single character string, and using said fetched input data character that is not included in said exclusion table structure as a single character string to begin a next string search for a longest match.

6. The compression method of claim 5 wherein said modifying step includes counting the number of times a single character string is encountered in said exclusion table structure, thereby providing an exclusion table string count for said single character string, and deleting a single character string from said exclusion table structure if said exclusion table string count therefor exceeds a predetermined threshold.

7. The compression method of claim 6 wherein said modifying step includes counting the number of times said single character string is determined not included in said exclusion table structure, thereby providing a storage means string count for said single character string, and storing said single character string in said exclusion table structure if said storage means string count therefor is less than a predetermined threshold.

8. The compression method of claim 1 further comprising performing said modifying step when said storage means is storing strings of data characters at a predetermined capacity thereof.

9. The compression method of claim 8 wherein said predetermined capacity comprises maximum capacity.

10. The compression method of claim 9 wherein a code counter assigns said respective codes associated with said strings stored in said storage means, further including performing said modifying step after detecting an overflow from said code counter.

11. The compression method of claim 1 wherein said step of providing an exclusion table structure comprises providing a plurality of exclusion tables for storing, respectively, single character strings, two character strings, succeeding length strings, up to strings having a predetermined string length limit, said method further includes the step of counting the number of characters of said extended string, and said comparing step includes comparing said extended string to the strings stored in the exclusion table that is storing strings having the same number of characters as said extended string.

12. The compression method of claim 11 wherein said step of counting the number of characters of said extended string provides a stored string character count therefor, and said modifying step includes adding strings to said plurality of exclusion tables in accordance with said stored string character counts therefor.

13. The compression method of claim 11 further including a method for populating said plurality of exclusion tables with data character strings for exclusion from said storage means, comprising:

providing a body of data characters representative of said input stream of data characters over which compression will be performed, establishing a plurality of linked list data trees, each beginning with a root node representative of a respective character of the alphabet over which compression will be performed, each said root node having a counter associated therewith, said plurality of data trees including a plurality of chains of linked descendent nodes said chains being linked to said root nodes, each descendent node having a counter associated therewith, reading each data character string, up to said string length limit, from said body of data characters into said plurality of data trees, providing a root node and a linked chain of descendent nodes for the respective characters of each said string, incrementing each node counter as the associated character is encountered, and selecting a string from said plurality of data trees for populating one of said plurality of exclusion tables when the node counter of the node associated with said string contains a count less than a predetermined threshold.

14. The compression method of claim 13 wherein said data trees are arranged in levels with said root nodes on a first level, descendent nodes of said root nodes on a second level with succeeding descendent nodes on respective succeeding levels up to a level corresponding to said string length limit, selecting the strings for populating said exclusion table of single character strings from the nodes of said first level, selecting the strings for populating said exclusion table of two character strings from the nodes of said second level, selecting the strings for populating said exclusion tables of succeeding length strings from nodes on said respective succeeding levels and selecting strings for populating said exclusion table of strings of said string length limit from the nodes of said level corresponding to said string length limit.

15. The compression method of claim 1 further including providing a string length limit, counting the number of characters of said extended string, and bypassing the steps of storing said extended string in said storage means and assigning a code corresponding to said stored extended string if said number of characters of said extended string exceeds said string length limit.

16. The compression method of claim 15 further including determining if the characters of said extended string are the same with respect to each other when the number of characters of said extended string exceeds said string length limit, and storing said extended string in said storage means and assigning a code corresponding to said stored extended string if said number of characters of said extended string exceeds said string length limit and said characters of said extended string are the game with respect to each other.

17. A data decompression method for decompressing an input stream of compressed codes into a recovered output stream of data characters corresponding thereto, said decompression method operating in decompression cycles, comprising:

storing, in storage means, strings of data characters derived from strings corresponding to said compressed codes, said stored strings having respective codes associated therewith, fetching an input compressed code in a current decompression cycle, thereby providing a current code, outputting the string corresponding to said current code so as to provide said recovered output stream of data characters, providing a previous code corresponding to a code fetched in the decompression cycle prior to said current decompression cycle, providing an exclusion table structure for storing strings of data characters to be excluded from storage in said storage means, forming an extended string comprising the string corresponding to said previous code extended by the first data character of said string corresponding to said current code, comparing said extended string to the strings of data characters stored in said exclusion table structure to determine if said extended string is included therein, storing said extended string in said storage means and assigning a code corresponding to said stored extended string if said extended string is not included in said exclusion table structure, bypassing the steps of storing said extended string in said storage means and assigning a code corresponding to said stored extended string if said extended string is included in said exclusion table structure, setting said previous code to said current code, and modifying the contents of said exclusion table structure by deleting strings therefrom that are frequently encountered therein and adding strings thereto that are infrequently encountered in said storage means during said decompression cycles in response to the fetched current codes.

18. The decompression method of claim 17 wherein said modifying step includes counting the number of times a string is encountered in said exclusion table structure, thereby providing an exclusion table string count for said encountered string, and deleting said encountered string from said exclusion table structure if said exclusion table string count therefor exceeds a predetermined threshold.

19. The decompression method of claim 17 wherein said modifying step includes counting the number of times a stored string is encountered in said storage means, thereby providing a storage means string count for said encountered string, and storing said encountered string in said exclusion table structure if said storage means string count therefor is less than a predetermined threshold.

20. The decompression method of claim 19 wherein said modifying step further includes providing a storage means string count of 1 for said extended string when said extended string is stored in said storage means.

21. The decompression method of claim 19 further including determining if said current code represents a multiple character string stored in said storage means, and if said current code represents a multiple character string stored in said storage means, recovering, from said storage means, the characters of said string corresponding to said current code, said outputting step comprising outputting said characters of said string corresponding to said current code so as to provide said recovered output stream of data characters.

22. The decompression method of claim 21 wherein said modifying step includes maintaining a storage means string count for said multiple character string and for each prefix string thereof, so as to count the number of times said multiple character string and each prefix string thereof is encountered in said storage means, and storing each said encountered string in said exclusion table structure if said storage means string count therefor is less than a predetermined threshold.

23. The decompression method of claim 17 further including determining if said current code represents a single character string, if said current code represents a single character string, said forming step comprises forming an extended string comprising said string corresponding to said previous code extended by the character of said single character string, and said outputting step comprises outputting said character of said single character string so as to provide said recovered output stream of data characters.

24. The decompression method of claim 23 further comprising (a) comparing said single character string to said strings of data characters stored in said exclusion table structure to determine if said single character string is included therein, (b) if said single character string is not included in said exclusion table structure, performing said step of setting said previous code to said current code and proceeding to a next decompression cycle, (c) if said single character string is included in said exclusion table structure, fetching a next input compressed code, (d) if said next fetched input compressed code represents a single character string that is included in said exclusion table structure, outputting the character of said single character string that is included in said exclusion table structure, fetching a next input compressed code and repeating step (d), (e) if said next fetched input compressed code represents a single character string not included in said exclusion table structure, outputting the character of said single character string that is not included in said exclusion table structure, setting said previous code to said fetched input compressed code representative of said single character string not included in said exclusion table structure, and proceeding to said next decompression cycle, if said next fetched input compressed code represents a multiple character string, said decompression method includes the following steps prior to proceeding to said next decompression cycle, (f) recovering, from said storage means, the characters of said multiple character string, (g) outputting said characters of said multiple character string so as to provide said recovered output stream of data characters, and (h) setting said previous code to said fetched input compressed code representative of said multiple character string.

25. The decompression method of claim 24 wherein said modifying step includes counting the number of times a single character string is encountered in said exclusion table structure, thereby providing an exclusion table string count for said single character string, and deleting a single character string from said exclusion table structure if said exclusion table string count therefor exceeds a predetermined threshold.

26. The decompression method of claim 25 wherein said modifying step includes counting the number of times said single character string is determined not included in said exclusion table structure, thereby providing a storage means string count for said single character string, and storing said single character string in said exclusion table structure if said storage means string count therefor is less than a predetermined threshold.

27. The decompression method of claim 24 wherein said modifying step includes maintaining a storage means string count for said multiple character string and for each prefix string thereof, so as to count the number of times said multiple character string and each prefix string thereof is encountered in said storage means, and storing each said encountered string in said exclusion table structure if said storage means string count therefor is less than a predetermined threshold.

28. The decompression method of claim 17 further including determining if said current code represents a multiple character string not stored in said storage means, if said current code represents a multiple character string not stored in said storage means, performing exception case processing by forming an exception case string comprising said string corresponding to said previous code extended by the first data character of said string corresponding to said previous code, storing said exception case string in said storage means, assigning a code corresponding to said stored exception case string, and wherein said outputting step comprises outputting the characters of said exception case string so as to provide said recovered output stream of data characters, said setting step comprises setting said previous code to said current code representing said string not included in said storage means.

29. The decompression method of claim 28 wherein said modifying step includes maintaining a storage means string count for said exception case string and for each prefix string thereof, so as to count the number of times said exception case string and each prefix string thereof is encountered in said storage means, and storing each said encountered string in said exclusion table structure if said storage means string count therefor is less than a predetermined threshold.

30. The decompression method of claim 28 further including a step of providing an exception case string count for use in a next decompression cycle comprising providing a count of the characters of said string corresponding to said previous code, and adding 1 to said count of said characters of said string corresponding to said previous code thereby providing said exception case string count.

31. The decompression method of claim 17 further comprising performing said modifying step when said storage means is storing strings of data characters at a predetermined capacity thereof.

32. The decompression method of claim 31 wherein said predetermined capacity comprises maximum capacity.

33. The decompression method of claim 32 wherein a code counter assigns said respective codes associated with said strings stored in said storage means, further including performing said modifying step after detecting an overflow from said code counter.

34. The decompression method of claim 17 wherein said step of providing an exclusion table structure comprises providing a plurality of exclusion tables for storing, respectively, single character strings, two character strings, succeeding length strings, up to strings having a predetermined string length limit, said method further includes the step of providing a count of the number of characters of said extended string thereby providing a stored string character count therefor, and said comparing step includes comparing said extended string to the strings stored in the exclusion table that is storing strings having the same number of characters as said extended string.

35. The decompression method of claim 34 wherein said modifying step includes adding strings to said plurality of exclusion tables in accordance with said stored string character counts therefor.

36. The decompression method of claim 17 further including providing a string length limit, providing a count of the number of characters of said extended string, and bypassing the steps of storing said extended string in said storage means and assigning a code corresponding to said stored extended string if said number of characters of said extended string exceeds said string length limit.

37. The decompression method of claim 36 further including determining if the characters of said extended string are the same with respect to each other when the number of characters of said extended string exceeds said string length limit, and storing said extended string in said storage means and assigning a code corresponding to said stored extended string if said number of characters of said extended string exceeds said string length limit and said characters of said extended string are the same with respect to each other.

38. The decompression method of claim 34 wherein said step of providing a count of the number of characters of said extended string comprises providing a count of the number of characters of the string corresponding to said previous code, and incrementing said count of the number of characters of said string corresponding to said previous code by one thereby providing said count of the number of characters of said extended string.

39. Data compression apparatus for compressing an input stream of data characters into an output stream of compressed codes, comprising:

storage means for storing strings of data characters encountered in said input stream, said stored strings having respective codes associated therewith, means for searching said input stream by comparing said input stream to said stored strings to determine the longest match therewith, means for outputting the code associated with said longest match so as to provide said output stream of compressed codes, an exclusion table structure for storing strings of data characters to be excluded from storage in said storage means, means for forming an extended string comprising said longest match extended by the next data character in said input stream following said longest match, means for comparing said extended string to the strings of data characters stored in said exclusion table structure to determine if said extended string is included therein, means for storing said extended string in said storage means and assigning a code corresponding to said stored extended string if said extended string is not included in said exclusion table structure, means for bypassing storing said extended string in said storage means and assigning a code corresponding to said stored extended string if said extended string is included in said exclusion table structure, and means for modifying the contents of said exclusion table structure by deleting strings therefrom that are frequently encountered therein and adding strings thereto that are infrequently encountered in said storage means.

40. The compression apparatus of claim 39 wherein said modifying means includes means for counting the number of times a string is encountered in said exclusion table structure, thereby providing an exclusion table string count for said encountered string, and means for deleting said encountered string from said exclusion table structure if said exclusion table string count therefor exceeds a predetermined threshold.

41. The compression apparatus of claim 39 wherein said modifying means includes means for counting the number of times a stored string is encountered in said storage means, thereby providing a storage means string count for said encountered string, and means for storing said encountered string in said exclusion table structure if said storage means string count therefor is less than a predetermined threshold.

42. The compression apparatus of claim 41 wherein said modifying means further includes means for providing a storage means string count of 1 for said extended string when said extended string is stored in said storage means.

43. The compression apparatus of claim 42 wherein said searching means comprises means for comparing said input stream to said stored strings until a mismatching input data character occurs, thereby determining said longest match, said apparatus further including, means for determining if said mismatching character is included in said exclusion table structure as a single character string, means for using said mismatching character to begin a next string search for a longest match if said mismatching character is not included in said exclusion table structure as a single character string, means operative, if said mismatching character is included in said exclusion table structure as a single character string, for outputting said mismatching character and fetching and outputting further input data characters until an input data character is fetched that is not included in said exclusion table structure as a single character string, and means for using said fetched input data character that is not included in said exclusion table structure as a single character string to begin a next string search for a longest match.

44. The compression apparatus of claim 43 wherein said modifying means includes means for counting the number of times a single character string is encountered in said exclusion table structure, thereby providing an exclusion table string count for said single character string, and means for deleting a single character string from said exclusion table structure if said exclusion table string count therefor exceeds a predetermined threshold.

45. The compression apparatus of claim 43 wherein said modifying means includes means for counting the number of times said single character string is determined not included in said exclusion table structure, thereby providing a storage means string count for said single character string, and means for storing said single character string in said exclusion table structure if said storage means string count therefor is less than a predetermined threshold.

46. The compression apparatus of claim 39 wherein said modifying means is operative for modifying the contents of said exclusion table structure when said storage means is storing strings of data characters at a predetermined capacity thereof.

47. The compression apparatus of claim 46 wherein said predetermined capacity comprises maximum capacity.

48. The compression apparatus of claim 47 further including a code counter for assigning said respective codes associated with said strings stored in said storage means, said modifying means being operative for modifying the contents of said exclusion table structure after detecting an overflow from said code counter.

49. The compression apparatus of claim 39 wherein said exclusion table structure comprises a plurality of exclusion tables for storing, respectively, single character strings, two character strings, succeeding length strings, up to strings having a predetermined string length limit, said apparatus further including means for counting the number of characters of said extended string, thereby providing a stored string character count therefor and said comparing means includes means for comparing said extended string to the strings stored in the exclusion table that is storing strings having the same number of characters as said extended string.

50. The compression apparatus of claim 49 wherein said modifying means is operative for adding strings to said plurality of exclusion tables in accordance with said stored string character counts therefor.

51. The compression apparatus of claim 39 further including means for providing a string length limit, means for counting the number of characters of said extended string, and means for bypassing storing said extended string in said storage means and assigning a code corresponding to said stored extended string if said number of characters of said extended string exceeds said string length limit.

52. The compression apparatus of claim 51 further including means for determining if the characters of said extended string are the same with respect to each other when the number of characters of said extended string exceeds said string length limit, and means for storing said extended string in said storage means and assigning a code corresponding to said stored extended string if said number of characters of said extended string exceeds said string length limit and said characters of said extended string are the same with respect to each other.

53. Data decompression apparatus for decompressing an input stream of compressed codes into a recovered output stream of data characters corresponding thereto, said decompression apparatus operating in decompression cycles, comprising:

storage means for storing strings of data characters derived from strings corresponding to said compressed codes, said stored strings having respective codes associated therewith, means for fetching an input compressed code in a current decompression cycle, thereby providing a current code, means for outputting the string corresponding to said current code so as to provide said recovered output stream of data characters, means for providing a previous code corresponding to a code fetched in the decompression cycle prior to said current decompression cycle, an exclusion table structure for storing strings of data characters to be excluded from storage in said storage means, means for forming an extended string comprising the string corresponding to said previous code extended by the first data character of said string corresponding to said current code, means for comparing said extended string to the strings of data characters stored in said exclusion table structure to determine if said extended string is included therein, means for storing said extended string in said storage means and assigning a code corresponding to said stored extended string if said extended string is not included in said exclusion table structure, means for bypassing storing said extended string in said storage means and assigning a code corresponding to said stored extended string if said extended string is included in said exclusion table structure, means for setting said previous code to said current code, and means for modifying the contents of said exclusion table structure by deleting strings therefrom that are frequently encountered therein and adding strings thereto that are infrequently encountered in said storage means during said decompression cycles in response to the fetched current codes.

54. The decompression apparatus of claim 53 wherein said modifying means includes means for counting the number of times a string is encountered in said exclusion table structure, thereby providing an exclusion table string count for said encountered string, and means for deleting said encountered string from said exclusion table structure if said exclusion table string count therefor exceeds a predetermined threshold.

55. The decompression apparatus of claim 53 wherein said modifying means includes means for counting the number of times a stored string is encountered in said storage means, thereby providing a storage means string count for said encountered string, and means for storing said encountered string in said exclusion table structure if said storage means string count therefor is less than a predetermined threshold.

56. The decompression apparatus of claim 55 wherein said modifying means further includes means for providing a storage means string count of 1 for said extended string when said extended string is stored in said storage means.

57. The decompression apparatus of claim 55 further including means for determining if said current code represents a multiple character string stored in said storage means, and means operative, if said current code represents a multiple character string stored in said storage means, for recovering, from said storage means, the characters of said string corresponding to said current code, said outputting means comprising means for outputting said characters of said string corresponding to said current code so as to provide said recovered output stream of data characters.

58. The decompression apparatus of claim 57 wherein said modifying means includes means for maintaining a storage means string count for said multiple character string and for each prefix string thereof, so as to count the number of times said multiple character string and each prefix string thereof is encountered in said storage means, and means for storing each said encountered string in said exclusion table structure if said storage means string count therefor is less than a predetermined threshold.

59. The decompression apparatus of claim 53 further including means for determining if said current code represents a single character string, if said current code represents a single character string, said forming means is operative for forming an extended string comprising said string corresponding to said previous code extended by the character of said single character string, and said outputting means is operative for outputting said character of said single character string so as to provide said recovered output stream of data characters.

60. The decompression apparatus of claim 59 further comprising means for comparing said single character string to said strings of data characters stored in said exclusion table structure to determine if said single character string is included therein, said decompression apparatus operative (a) if said single character string is not included in said exclusion table structure, for setting said previous code to said current code and proceeding to a next decompression cycle, (b) if said single character string is included in said exclusion table structure, for fetching a next input compressed code, (c) if said next fetched input compressed code represents a single character string that is included in said exclusion table structure, for outputting the character of said single character string that is included in said exclusion table structure, fetching a next input compressed code and repeating (c), (d) if said next fetched input compressed code represents a single character string not included in said exclusion table structure, for outputting the character of said single character string that is not included in said exclusion table structure, setting said previous code to said fetched input compressed code representative of said single character string not included in said exclusion table structure, and proceeding to said next decompression cycle, if said next fetched input compressed code represents a multiple character string, said decompression apparatus is operative for performing the following prior to proceeding to said next decompression cycle, (e) recovering, from said storage means, the characters of said multiple character string, (f) outputting said characters of said multiple character string so as to provide said recovered output stream data characters, and (g) setting said previous code to said fetched input compressed code representative of said multiple character string.

61. The decompression apparatus of claim 60 wherein said modifying means includes means for counting the number of times a single character string is encountered in said exclusion table structure, thereby providing an exclusion table string count for said single character string, and means for deleting a single character string from said exclusion table structure if said exclusion table string count therefor exceeds a predetermined threshold.

62. The decompression apparatus of claim 61 wherein said modifying means includes means for counting the number of times said single character string is determined not included in said exclusion table structure, thereby providing a storage means string count for said single character string, and means for storing said single character string in said exclusion table structure if said storage means string count therefor is less than a predetermined threshold.

63. The decompression apparatus of claim 60 wherein said modifying means includes means for maintaining a storage means string count for said multiple character string and for each prefix string thereof, so as to count the number of times said multiple character string and each prefix string thereof is encountered in said storage means, and means for storing each said encountered string in said exclusion table structure if said storage means string count therefor is less than a predetermined threshold.

64. The decompression apparatus of claim 53 further including means for determining if said current code represents a multiple character string not stored in said storage means, means operative, if said current code represents a multiple character string not stored in said storage means, for performing exception case processing by forming an exception case string comprising said string corresponding to previous code extended by the first data character of said string corresponding to said previous code, storing said exception case string in said storage means, assigning a code corresponding to said stored exception case string, and wherein said outputting means comprises means for outputting the characters of said exception case string so as to provide said recovered output stream of data characters, said setting means comprises means for setting said previous code to said current code representing said string not included in said storage means.

65. The decompression apparatus of claim 64 wherein said modifying means includes means for maintaining a storage means string count for said exception case string and for each prefix string thereof, so as to count the number of times said exception case string and each prefix string thereof is encountered in said storage means, and means for storing each said encountered string in said exclusion table structure if said storage means string count therefor is less than a predetermined threshold.

66. The decompression apparatus of claim 64 further including means for providing an exception case string count for use in a next decompression cycle comprising means for providing a count of the characters of said string corresponding to said previous code, and means for adding 1 to said count of said characters of said string corresponding to said previous code thereby providing said exception case string count.

67. The decompression apparatus of claim 53 wherein said modifying means is operative for modifying the contents of said exclusion table structure when said storage means is storing strings of data characters at a predetermined capacity thereof.

68. The decompression apparatus of claim 67 wherein said predetermined capacity comprises maximum capacity.

69. The decompression apparatus of claim 68 further including a code counter for assigning said respective codes associated with said strings stored in said storage means, said modifying means being operative for modifying the contents of said exclusion table structure after detecting an overflow from said code counter.

70. The decompression apparatus of claim 53 wherein said exclusion table structure comprises a plurality of exclusion tables for storing, respectively, single character strings, two character strings, succeeding length strings, up to strings having a predetermined string length limit, said apparatus further includes means for providing a count of the number of characters of said extended string thereby providing a stored string character count therefor, and said comparing means includes means for comparing said extended string to the strings stored in the exclusion table that is storing strings having the same number of characters as said extended string.

71. The decompression apparatus of claim 70 wherein said modifying means includes means for adding strings to said plurality of exclusion tables in accordance with said stored string character counts therefor.

72. The decompression apparatus of claim 70 wherein said means for providing a count of the number of characters of said extended string comprises means for providing a count of the number of characters of the string corresponding to said previous code, and means for incrementing said count of the number of characters of said string corresponding to said previous code by one thereby providing said count of the number of characters of said extended string.

73. The decompression apparatus of claim 53 further including means for providing a string length limit, means for providing a count of the number of characters of said extended string, and means for bypassing storing said extended string in said storage means and assigning a code-corresponding to said stored extended string if said number of characters of said extended string exceeds said string length limit.

74. The decompression apparatus of claim 73 further including means for determining if the characters of said extended string are the same with respect to each other when the number of characters of said extended string exceeds said string length limit, and means for storing said extended string in said storage means and assigning a code corresponding to said stored extended string if said number of characters of said extended string exceeds said string length limit and said characters of said extended string are the same with respect to each other.

\* \* \* \* \*